US012176370B2

(12) United States Patent
Kao et al.

(10) Patent No.: US 12,176,370 B2
(45) Date of Patent: Dec. 24, 2024

(54) STACKED STRUCTURE FOR CMOS IMAGE SENSORS INCLUDING THROUGH-SUBSTRATE-VIA CONTACTING NEGATIVE BIAS CIRCUIT

(71) Applicant: Taiwan Semiconductor Manufacturing Co., Ltd., Hsinchu (TW)

(72) Inventors: Min-Feng Kao, Chiayi (TW); Dun-Nian Yaung, Taipei (TW); Jen-Cheng Liu, Hsin-Chu (TW); Wen-Chang Kuo, Tainan (TW); Sheng-Chau Chen, Tainan (TW); Feng-Chi Hung, Chu-Bei (TW); Sheng-Chan Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 390 days.

(21) Appl. No.: 17/336,852

(22) Filed: Jun. 2, 2021

(65) Prior Publication Data
US 2022/0238568 A1 Jul. 28, 2022

Related U.S. Application Data

(60) Provisional application No. 63/142,029, filed on Jan. 27, 2021.

(51) Int. Cl.
*H01L 27/146* (2006.01)
(52) U.S. Cl.
CPC .... *H01L 27/1463* (2013.01); *H01L 27/14636* (2013.01); *H01L 27/14683* (2013.01)
(58) Field of Classification Search
CPC .......... H01L 27/1463; H01L 27/14636; H01L 27/14643; H01L 27/14683
(Continued)

(56) References Cited

U.S. PATENT DOCUMENTS 10,847,564 B1 * 11/2020 Su .................. H01L 27/14625
11,063,090 B2 * 7/2021 Choi .................. H04N 25/75
(Continued)

FOREIGN PATENT DOCUMENTS

DE 102018125374 A1 5/2019
TW 202017161 A 5/2020

OTHER PUBLICATIONS

Non-Final Office Action dated Oct. 23, 2024, for U.S. Appl. No. 18/442,357.

*Primary Examiner* — Matthew E. Gordon
(74) *Attorney, Agent, or Firm* — Eschweiler & Potashnik, LLC

(57) ABSTRACT

Some embodiments relate to an image sensor. The image sensor includes a semiconductor substrate including a pixel region and a peripheral region. A backside isolation structure extends into a backside of the semiconductor substrate and laterally surrounds the pixel region. The backside isolation structure includes a metal core, and a dielectric liner separates the metal core from the semiconductor substrate. A conductive feature is disposed over a front side of the semiconductor substrate. A through substrate via extends from the backside of the semiconductor substrate through the peripheral region to contact the conductive feature. The through substrate via is laterally offset from the backside isolation structure. A conductive bridge is disposed beneath the backside of the semiconductor substrate and electrically couples the metal core of the backside isolation structure to the through substrate via.

20 Claims, 17 Drawing Sheets

(58) Field of Classification Search
USPC .......................................................... 257/446
See application file for complete search history.

(56) References Cited

U.S. PATENT DOCUMENTS

| | | |
|---|---|---|
| 2013/0323875 A1 | 12/2013 | Park et al. |
| 2015/0255495 A1* | 9/2015 | Park ................. H01L 27/14621 |
| | | 257/446 |
| 2018/0033811 A1 | 2/2018 | Zheng et al. |
| 2018/0204874 A1 | 7/2018 | Lee et al. |
| 2019/0148457 A1 | 5/2019 | Lee et al. |
| 2019/0172868 A1 | 6/2019 | Chen et al. |
| 2022/0005849 A1* | 1/2022 | Zang ................. H01L 27/14621 |
| 2022/0109016 A1* | 4/2022 | Kim ................. H01L 27/14636 |

* cited by examiner

STACKED STRUCTURE FOR CMOS IMAGE SENSORS INCLUDING THROUGH-SUBSTRATE-VIA CONTACTING NEGATIVE BIAS CIRCUIT

REFERENCE TO RELATED APPLICATION

This application claims the benefit of U.S. Provisional Application No. 63/142,029, filed on Jan. 27, 2021, the contents of which are hereby incorporated by reference in their entirety.

BACKGROUND

Integrated circuits (IC) with image sensors are used in a wide range of modern-day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. As IC's shrink in size, the small pixel sizes in CMOS devices are desirable. With smaller pixel sizes, cross-talk between pixels can become a concern where unique solutions can improve the performance of small CMOS pixel sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
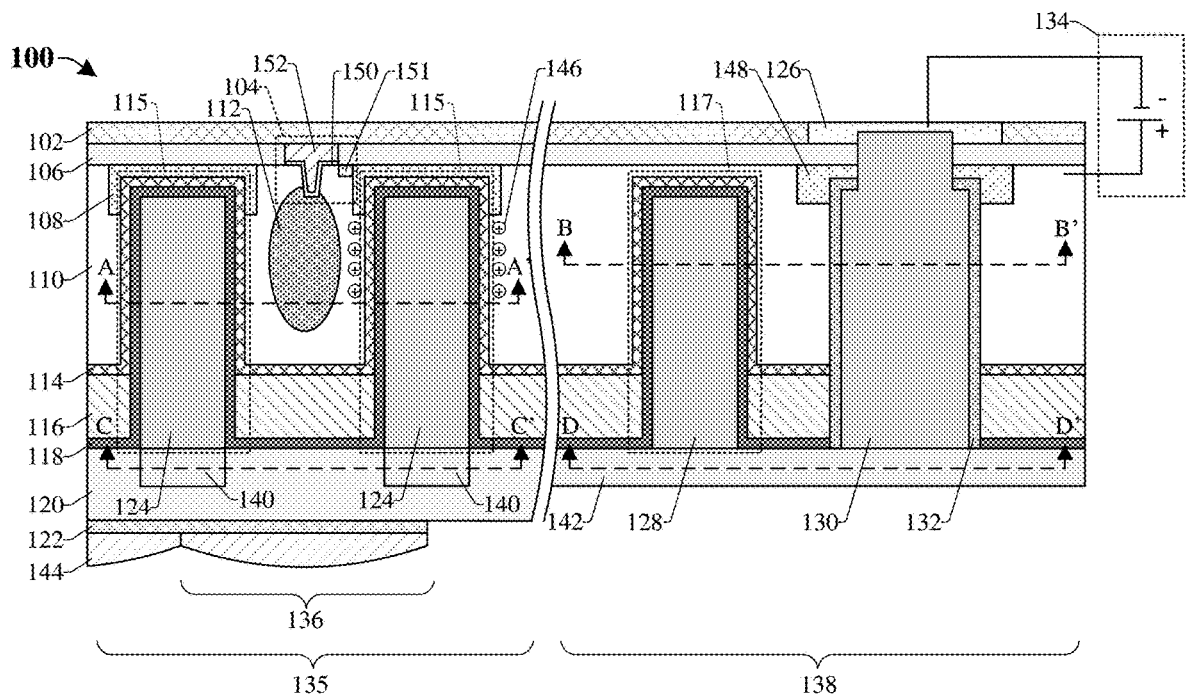
FIG. 1 illustrates a cross-sectional view of some embodiments of an image sensor including a negative bias circuit coupled to a peripheral region configured to negatively bias a pixel array region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include a semiconductor substrate with the array of photodetectors and a backside isolation structure arranged within the semiconductor substrate. The backside isolation structure forms an isolation grid made up of square-shaped or ring-shaped grid segments whose outer edges adjoin one another to make up the isolation grid. Each grid segment laterally surrounds one or more photodetectors of the array of photodetectors, and reduces cross-talk between the one or more photodetectors and adjacent photodetectors. Thus, the backside isolation structure reduces cross-talk by preventing photons directed towards a first photodetector of the array of photodetectors from traveling to and being absorbed by/sensed by a second photodetector of the array of photodetectors. However, as the associated photodetectors and isolation grid reduce in size, the cross-talk between photodetectors can increase and the quantum efficiency of the photodetectors can decrease.

One approach to improving the performance of image sensors with reduced isolation grid sizes is to negatively bias a backside isolation structure in a pixel array region. In some embodiments, the image sensor may be formed with the pixel array region comprising the photodetectors and the backside isolation structure, as well as a peripheral region that comprises a negative bias circuit coupled to the backside isolation structure. As such, the image sensor includes a through substrate via laterally offset from the backside isolation structure and extending through a backside of the semiconductor substrate in the peripheral region. A conductive feature is disposed over a front side of the semiconductor substrate contacting the through substrate via. A backside connecting structure disposed within the semiconductor substrate extends across both the pixel array region and the peripheral region and electrically couples to the backside isolation structure. A conductive bridge disposed beneath the backside of the semiconductor substrate electrically couples the backside isolation structure to the through substrate via. A negative bias circuit is coupled to the conductive feature and the semiconductor substrate and is configured to apply a negative bias to the backside isolation structure through the conductive feature.

When a negative bias is applied to the backside isolation structure, a number of electron holes adjacent to the backside isolation structure within the semiconductor substrate is reduced relative to a no bias configuration. As such, the electrical conductance of the semiconductor substrate on opposing sides of the backside isolation structure is reduced for the negative bias configuration relative to the no bias configuration. The reduction in electrical conductance can result in decreased cross-talk between photodetectors and an increase of the quantum efficiency of the photodetectors. The sensing performance of the image sensor is improved and the reliability and/or an accuracy of images produced from the image sensor is improved.

FIG. 1 illustrates a cross-sectional view of some embodiments of an image sensor 100 including a negative bias circuit 134 coupled to a peripheral region 138 of the image sensor. The negative bias circuit 134 is configured to negatively bias a pixel array region 135 of the image sensor.

The image sensor 100 comprises a semiconductor substrate 110 including a pixel array region 135 including at least one pixel region 136 and a peripheral region 138 laterally offset from the pixel array region 135. In some embodiments, the semiconductor substrate 110 comprises any type of semiconductor body (e.g., monocrystalline silicon/CMOS bulk, silicon-germanium (SeGe), silicon on insulator (SOI), etc.) and/or has a first doping type (e.g., p-type doping). A first dielectric layer 102 is disposed over a front side of the semiconductor substrate 110. A second dielectric layer 106 separates the first dielectric layer 102 from the semiconductor substrate 110. A third dielectric layer 116 is disposed over a backside of the semiconductor substrate 110. The first, second, and third dielectric layers 102, 106, 116 may, for example, be or comprise an oxide, such as silicon dioxide, tantalum oxide, a dielectric, a low-k dielectric, another suitable oxide or dielectric.

Photodetectors 112 are disposed in the semiconductor substrate 110 between second dielectric layer 106 and third dielectric layer 116. The photodetectors 112 are configured to convert electromagnetic radiation (e.g., photons) into electrical signals. For example, the photodetectors 112 may generate electron-hole pairs from the electromagnetic radiation. The photodetectors 112 comprise a second doping type (e.g., n-type doping) opposite the first doping type. In some embodiments, the first doping type is p-type and the second doping type is n-type, or vice versa.

A backside isolation structure 115 extends into a backside of the semiconductor substrate 110 and laterally surrounds the pixel array region 135 and individual pixel regions within the pixel array region 135. The backside isolation structure 115 comprises a first dielectric liner 114, a metal core 124, and a second dielectric liner 118 that separates the first dielectric liner 114 from the metal core 124. The first dielectric liner 114 contacts sidewalls of the semiconductor substrate 110. The metal core 124 and the second dielectric liner 118 further extend through the third dielectric layer 116. The second dielectric liner 118 extends along sidewalls and a front side surface of the metal core 124, and further extends through a backside of the semiconductor substrate 110 to a backside surface of the third dielectric layer 116. The first dielectric liner 114 extends along sidewalls and a front side surface of the second dielectric liner 118, and further extends through the semiconductor substrate 110 to a backside surface of the semiconductor substrate 110. The first dielectric liner 114 and the second dielectric liner 118 may, for example, be or comprise an oxide, a metal oxide, aluminum oxide, hafnium oxide, a high-k dielectric, a low-k dielectric, or the like.

A top side of the backside isolation structure 115 is separated from the front side of the semiconductor substrate by a shallow trench isolation (STI) structure 108. The STI structure 108 extends across a topside surface of the first dielectric liner 114 and continuously extends along opposing sidewalls of the first dielectric liner 114. The STI structure 108 may, for example, be or comprise a dielectric material (e.g., silicon dioxide), a low-k dielectric, or the like.

A semiconductor device 104 is disposed in the second dielectric layer 106, protrudes into the front side of the semiconductor substrate 110, and couples to the photodetector 112. In some embodiments, the semiconductor device 104 may, for example, be a transfer transistor. A gate electrode 152 is disposed over a frontside of the semiconductor substrate 110, and a gate dielectric 150 separates the gate electrode 152 from the semiconductor substrate 110. The semiconductor device 104 may selectively form a conductive channel between the photodetector 112 and a source/drain region 151 corresponding to a floating diffusion node to transfer accumulated charge (e.g., via absorbing incident radiation) from the photodetector 112 to source/drain 151. In some embodiments, the gate electrode 152 may comprise, for example, polysilicon, aluminum, copper, or the like. In further embodiments, the gate dielectric 150 may comprise, for example, an oxide, a high-k dielectric, or the like.

A color filter layer 120 is disposed on a backside of the second dielectric layer 118, and a fourth dielectric layer 122 is disposed on a backside of a color filter layer 120. A plurality of micro-lenses 144 are disposed on a backside of the fourth dielectric layer 122. The fourth dielectric layer 122 may, for example, be a dielectric, such as a low-k dielectric or silicon dioxide, for example. The plurality of micro-lenses may, for example, be a micro-lens material, such as glass.

A through substrate via 130 is laterally offset from the backside isolation structure 115 within the peripheral region 138 and extends through a backside of the third dielectric layer 116, the second dielectric liner 118, the first dielectric liner 114, the semiconductor substrate 110, the second dielectric layer 106, and into the first dielectric layer 102. A via shallow trench isolation (STI) structure 148 extends from the backside surface of the second dielectric layer 106 into the semiconductor substrate 110 and laterally surrounds the through substrate via 130. A through dielectric liner 132 extends along outer sidewalls of the through substrate via from below a backside of the third dielectric layer 116 through the semiconductor substrate 110, and into the via STI structure 148. A conductive feature 126 is disposed within the first dielectric layer 102 and disposed over a front side of the second dielectric layer 106. The conductive feature 126 further contacts the through substrate via 130. The through dielectric liner 132 may, for example, be or comprise an oxide, a metal oxide, aluminum oxide, hafnium oxide, a high-k dielectric, a low-k dielectric, or the like.

Figure 2:
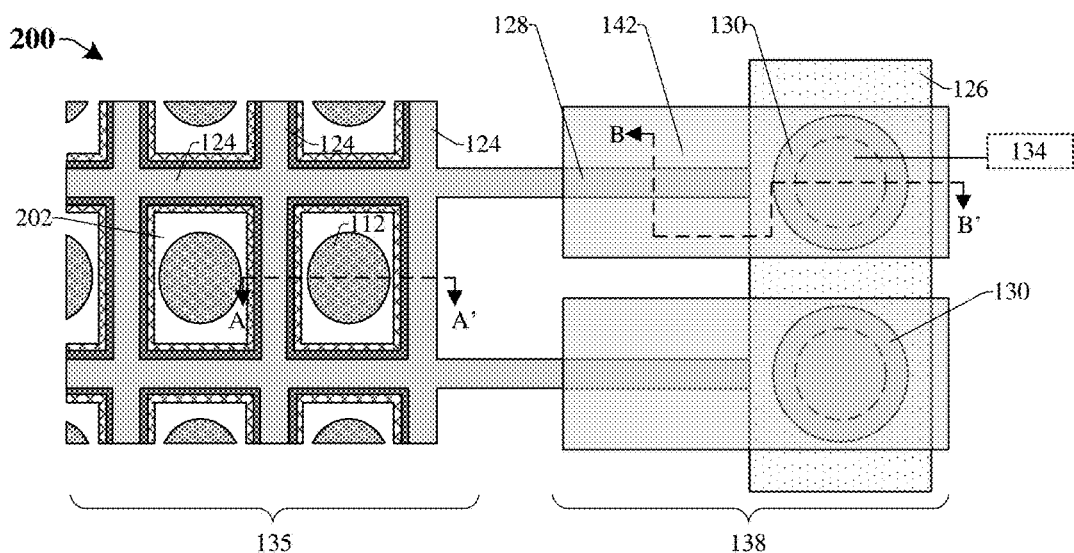
FIG. 2 illustrates a top view of some embodiments of the image sensor of FIG. 1 as indicated by cut-lines A-A' and B-B' in FIGS. 1 and 2.

The through substrate via 130 is electrically coupled to the metal core 124 through a connecting metal core 128 and a conductive bridge 142. Thus, the conductive feature 126 is electrically coupled to metal core 124 through the through substrate via 130. Referring briefly to FIG. 2 (which illustrates a top view of FIG. 1's image sensor), the connecting metal core 128 extends from the metal core 124 of the pixel array region 135 to the peripheral region 138. As such, the connecting metal core 128 is electrically coupled to the metal core 124. Furthermore, the connecting metal core 128, the first dielectric liner 114, and the second dielectric liner disposed in the peripheral region can be referred to as a backside connecting structure 117 that couples to the backside isolation structure 115. The conductive bridge 142 is disposed along a backside surface of the connecting metal core 128 and a backside surface of the through substrate via 130. The through substrate via 130, metal core 124, conductive feature 126, backside conductive trace 140, and conductive bridge 142 may, for example, be or comprise aluminum, copper, aluminum copper, tungsten, or the like. As seen in the top view 200, the photodetectors 112 are disposed within the semiconductor substrate 110 and between sidewalls of the metal core 124 to create an isolation cell 202. Thus, the metal core 124 is arranged as an isolation grid in which grid segments surround respective photodetectors 112. The isolation grid is made up of square-shaped or ring-shaped grid segments whose outer edges adjoin one another to make up the isolation grid.

Referring back to FIG. 1, a negative bias circuit 134 is electrically coupled to the conductive feature 126 and the semiconductor substrate 110. The negative bias circuit 134 is configured to apply a negative bias to the metal core 124 by way of the conductive feature 126, the through substrate via 130, the conductive bridge 142, and the connecting metal core 128. In some embodiments, the negative bias ranges from approximately −0.01V to −10V.

A number of electron holes 146 are disposed within the semiconductor substrate 110 adjacent to the backside isolation structure 115. In some embodiments, the image sensor 100 may transition amongst different bias states between exposure periods. As such, the image sensor 100 can be configured to apply one or more different bias states including a no bias state and a negative bias state at different times. When negative biasing is applied, the negative bias state results in a first number of electron holes 146 which is less than a second number of electron holes resulting from the no bias state being applied. The reduction in the number of electron holes 146 as a result of the negative bias state relative to the no bias state results in a reduction of the electrical conductance of the semiconductor substrate at opposing sides of the backside isolation structure within the semiconductor substrate 110. Likewise, the electrical resistance between the photodetectors 112 is increased for the negative bias state relative to the no bias state.

As a result of the negative bias circuit 134 configured to apply a negative bias to the metal core 124, the cross-talk between neighboring photodetectors 112 is reduced, and the quantum efficiency of the photodetectors 112 is increased. As such, the sensing performance of the image sensor 100 is improved and the reliability and/or accuracy of images produced from the image sensor 100 is improved.

Figure 3:
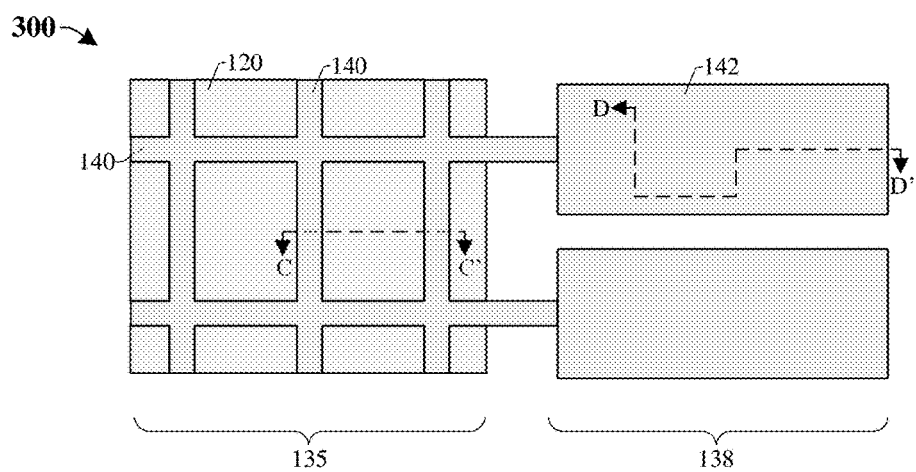
FIG. 3 illustrates a top view of some embodiments of the image sensor of FIG. 1 as indicated by cut-lines C-C' and D-D' in FIGS. 1 and 3.

FIG. 3 illustrates a top view 300 of some embodiments of the image sensor of FIG. 1 as indicated by cut-lines A-A' and C-C' in FIGS. 1 and 3. As seen in top view 300, a backside conductive trace 140 is arranged as a backside metal grid disposed within a color filter layer 120. The backside metal grid is made up of square-shaped or ring-shaped grid segments whose outer edges adjoin one another to make up the backside metal grid. The color filter layer 120 is configured to block a first range of frequencies of the electromagnetic radiation while passing a second range of frequencies of the electromagnetic radiation to the underlying photodetectors 112. The color filter layer 120 may, for example, comprise a dye-based or pigment based polymer or resin for filtering a specified wavelength of incoming radiation corresponding to a color spectrum (e.g. red, green, blue), or a material that allows for the transmission of the electromagnetic radiation having a specific range of frequencies, while electromagnetic radiation of frequencies outside of the specified range of frequencies is blocked from transmission. The backside conductive trace 140 is disposed along a backside of the metal core 124 (see FIG. 1) and a center of the backside conductive trace 140 is aligned with a center of the metal core 124 (see FIG. 1).

Figure 4A:
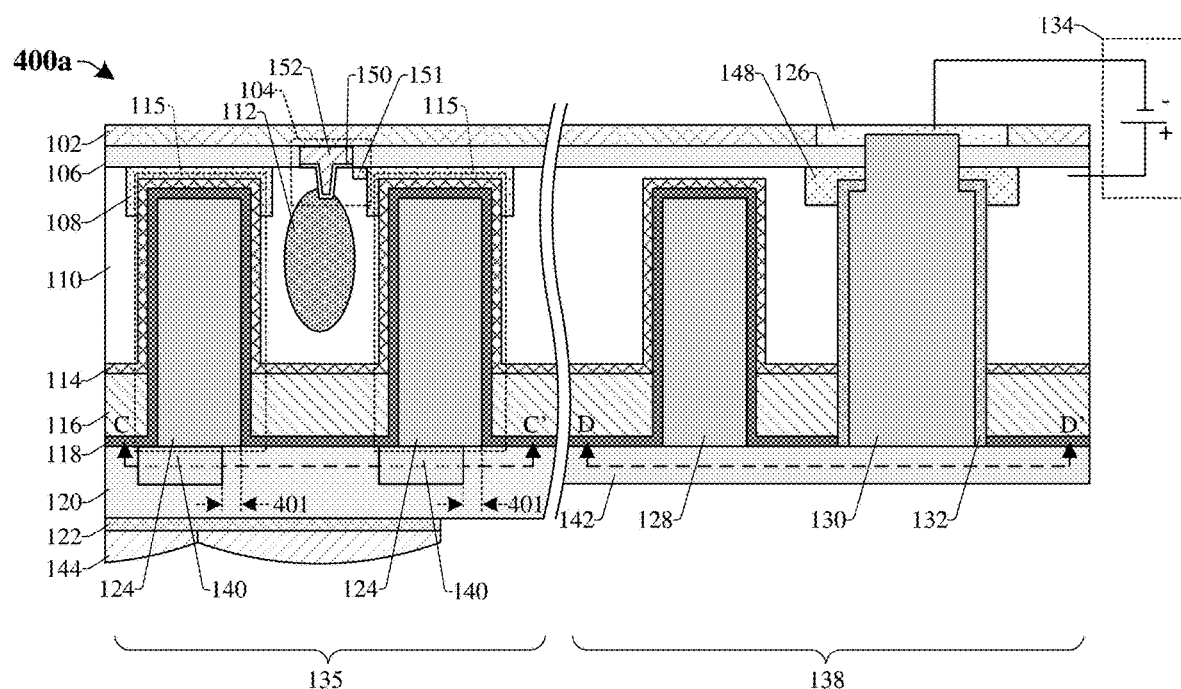
FIG. 4A illustrates a cross-sectional view of some embodiments of an image sensor including an offset backside conductive trace.

FIG. 4A illustrates a cross-sectional view of some embodiments of an image sensor 400a including an offset backside conductive trace 140. Image sensor 400a shows an alternative embodiment with regards to an offset of the backside conductive trace 140 relative to the metal core 124 (see offset 401). Thus, as shown by offset 401, sidewalls of the metal core 124 are offset from sidewalls of the backside conductive trace 140 in FIG. 4A, while conductive trace 140 and metal core 124 were aligned in FIG. 1. Image sensor 400a shares the same description for all of the embodiments described in FIG. 1 except for the backside conductive trace 140. Some features of FIG. 1 are omitted in FIG. 4A for ease of illustration.

In the image sensor 400a, a backside conductive trace 140 is disposed within a color filter layer 120 and disposed along a backside of the metal core 124 and aligned offset from the metal core 124. The backside conductive trace 140 overlaps with a backside surface of the second dielectric liner 118 where a surface of the backside conductive trace 140 continually spans from the second dielectric liner 118 to the metal core 124.

Figure 4B:
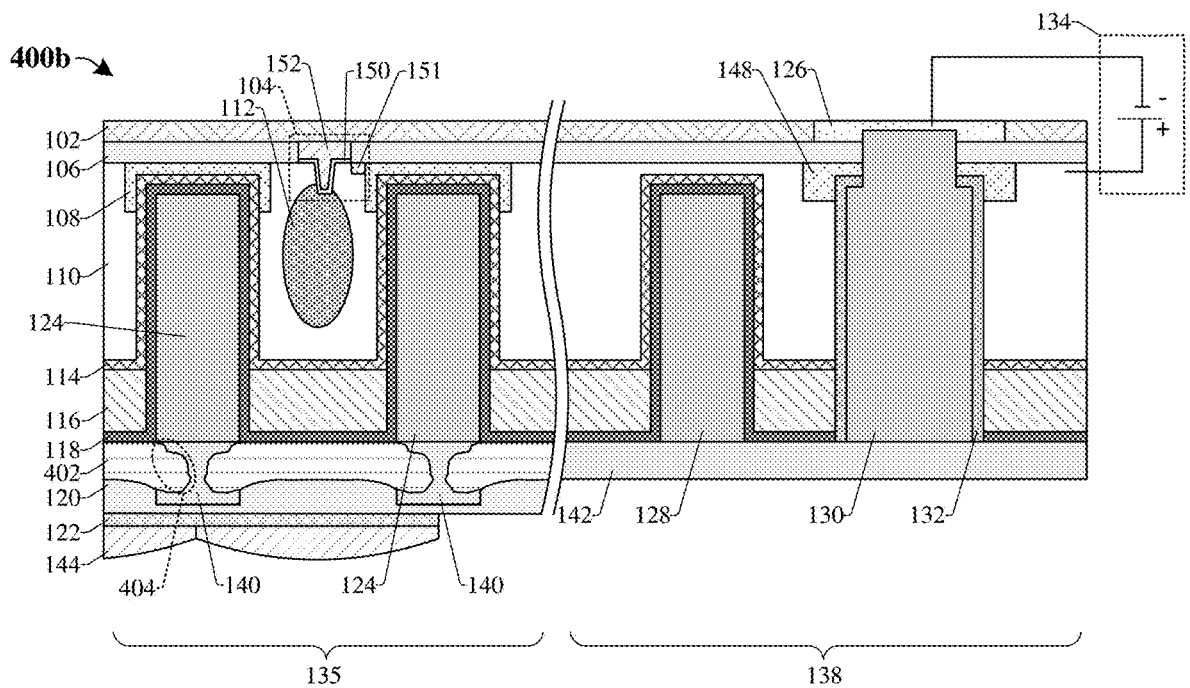
FIG. 4B illustrates a cross-sectional view of some embodiments of an image sensor including an irregular dielectric layer.

FIG. 4B illustrates a cross-sectional view of some embodiments of an image sensor 400b including an irregular dielectric layer 402. Image sensor 400b shows an alternative embodiment with regards to an irregular dielectric layer 402 that protrudes into outer sidewalls of a backside conductive trace 140. Image sensor 400b shares the same description for all of the embodiments described in FIG. 1 except for the backside conductive trace 140 and the irregular dielectric layer 402. Some features of FIG. 1 are omitted in FIG. 4B for ease of illustration.

In the image sensor 400b, a backside conductive trace 140 is disposed within a color filter layer 120 and disposed along a backside surface of the metal core 124 and aligned with the metal core 124. An irregular dielectric layer 402 is disposed along a backside of the second dielectric liner 118 and protrudes into opposing sidewalls of the backside conductive trace 140. Portions of the irregular dielectric layer 402 that protrude into the backside conductive trace 140 include an irregular sidewall with a series of curved shapes 404. Furthermore, the portions of the irregular dielectric layer 402 extend towards a backside of the backside conductive trace 140 where a first region of the irregular dielectric layer 402 bound by the conductive trace 140 has a first thickness that is thicker than a second region of the irregular dielectric layer 402 that is adjacent to the backside conductive trace 140. The irregular dielectric layer 402 may, for example, be or comprise an oxide, a metal oxide, aluminum oxide, hafnium oxide, a high-k dielectric, or the like. The irregular dielectric layer 402 may, for example, have a thickness range of 400 to 900 angstroms.

Figure 4C:
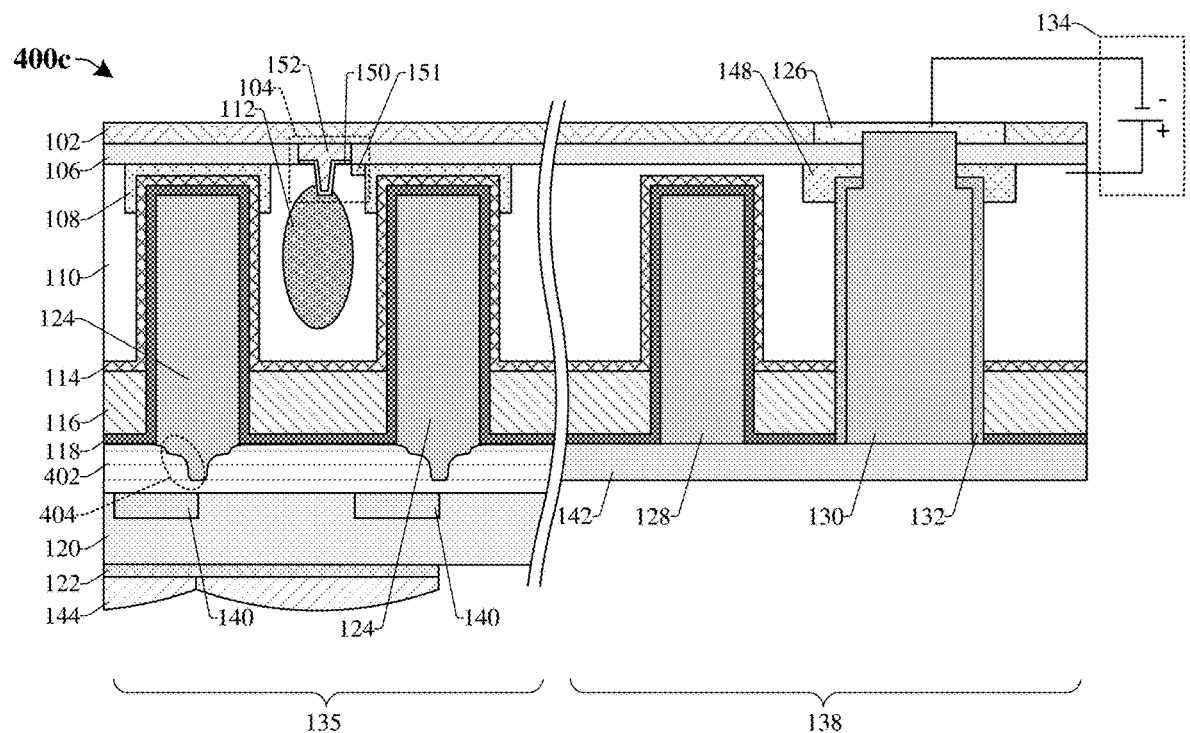
FIG. 4C illustrates a cross-sectional view of some embodiments of an image sensor including an offset backside conductive trace and an irregular dielectric layer.

FIG. 4C illustrates a cross-sectional view of some embodiments of an image sensor 400c including an offset backside conductive trace 140 and an irregular dielectric layer 402. Image sensor 400c shows an alternative embodiment with regards to an offset backside conductive trace 140 disposed on a backside surface of an irregular dielectric layer 402. Image sensor 400c shares the same description for all of the embodiments described in FIG. 1 except for the backside conductive trace 140, the metal core 124, and the irregular dielectric layer 402. Some features of FIG. 1 are omitted in FIG. 4C for ease of illustration.

In the image sensor 400c, an irregular dielectric layer 402 is disposed along a backside surface of the second dielectric liner 118 and a backside surface of the metal core 124. The metal core 124 extends from a first backside surface of the dielectric liner 118 to below a second backside surface of the dielectric liner 118. The metal core 124 protrudes into the irregular dielectric layer 402 such that a frontside surface of the irregular dielectric layer 402 include an irregular surface with a series of curved shapes. The irregular dielectric layer 402 in FIG. 4C separates the metal core 124 from the backside conductive trace 140. The color filter layer 120 is disposed along a backside surface of the irregular dielectric layer 402. A backside conductive trace 140 is disposed within the color filter layer 120 and along a backside surface of the irregular dielectric layer 402. The backside conductive trace 140 is aligned offset from the metal core 124. The backside conductive trace 140 overlaps with a backside surface of the second dielectric liner 118 where a surface of the backside conductive trace 140 continually spans from the second dielectric liner 118 to the metal core 124. The irregular dielectric layer 402 may, for example, be or comprise an oxide, a metal oxide, aluminum oxide, hafnium oxide, a high-k dielectric, or the like. The irregular dielectric layer 402 may, for example, have a thickness range of 200 to 350 angstroms.

Figure 5:
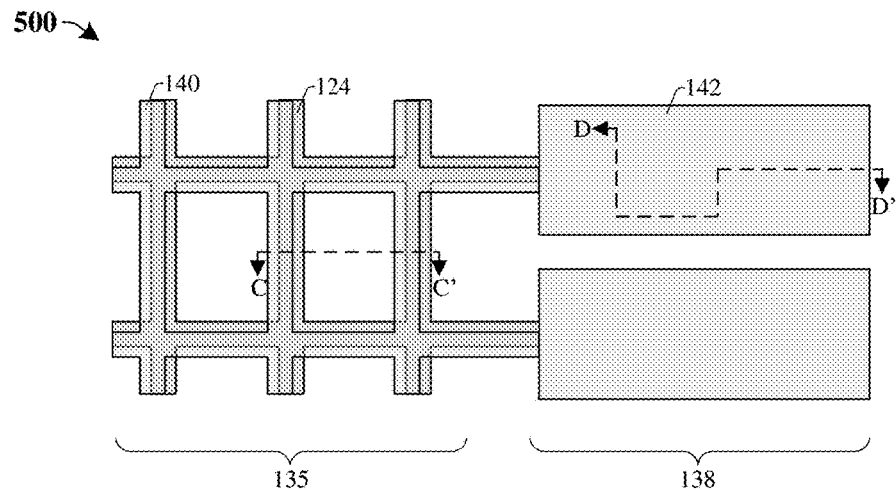
FIG. 5 illustrates a top view of some embodiments of the image sensor of FIG. 4A as indicated by cut-lines C-C' and D-D' of FIGS. 4A and 5.

FIG. 5 illustrates a top view 500 of some embodiments of the image sensor 400a of FIG. 4A as indicated by cut-lines C-C' and D-D' of FIGS. 4A and 5.

As seen in the top view 500, the metal core 124 is arranged as an isolation grid and the backside conductive trace 140 is arranged as a backside metal grid. For ease of illustration, the color filter layer 120 of FIG. 4A is omitted to show the offset alignment of the backside conductive trace 140 relative to the metal core 124. Vertical features of the backside metal grid are offset to the left of vertical features of the isolation grid. Horizontal features of the backside metal grid are offset below horizontal features of the isolation grid.

Figure 6A:
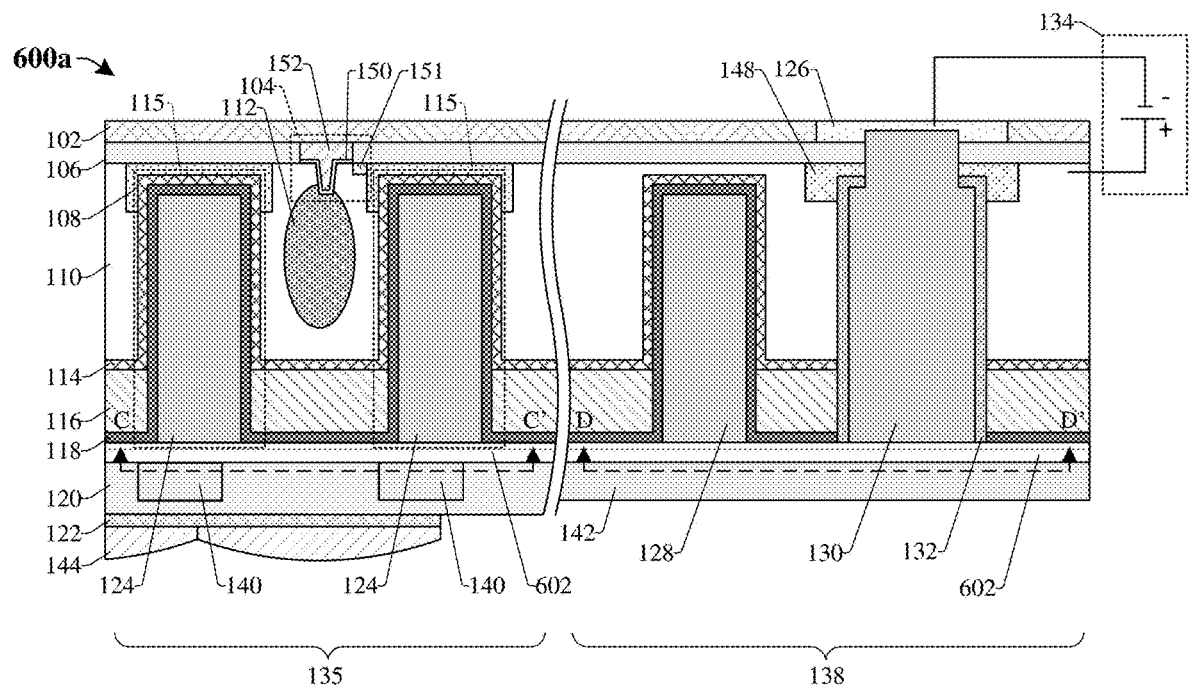
FIG. 6A illustrates a cross-sectional view of some embodiments of an image sensor including a separation layer.

FIG. 6A illustrates a cross-sectional view of some embodiments of an image sensor 600a including a separation layer 602. Image sensor 600a shows an alternative embodiment with regards to a separation layer 602 that separates a backside conductive trace 140 from a metal core 124. Image sensor 600a shares the same description for all of the embodiments described in FIG. 1 except for the backside conductive trace 140, color filter layer 120, the separation layer 602, and the conductive bridge 142. Some features of FIG. 1 are omitted in FIG. 6A for ease of illustration.

In the image sensor 600a, a separation layer 602 is disposed along a backside of the metal core 124 and along a backside surface of the second dielectric liner 118 in a pixel array region 135. Additionally, the separation layer 602 is disposed along the second dielectric liner 118, along a backside surface of a connecting metal core 128, along a backside surface of a through dielectric liner 132, and along a backside surface of through substrate via 130 in a peripheral region 138. The separation layer 602 may, for example, be or comprise an oxide, a metal oxide, aluminum oxide, hafnium oxide, a high-k dielectric, a low-k dielectric, or the like. A color filter layer 120 is disposed along a backside of the separation layer 602 in the pixel region. A conductive bridge 142 is disposed along a backside of the separation layer 602 in the peripheral region 138. A backside conductive trace 140 is disposed within the color filter layer 120 and disposed along a backside of the separation layer 602. In some embodiments, a center of the backside conductive trace 140 is offset from a center of the metal core 124. In other embodiments (not shown), the center of the backside conductive trace 140 is aligned with the center of the metal core 124, for example, as shown in FIG. 1 where the backside conductive trace 140 is aligned with the metal core 124. In some embodiments, the backside conductive trace 140 is electrically coupled to the metal core 124, but in other embodiments, the backside conductive trace 140 is electrically isolated from the metal core 124.

Figures 6B, 7:
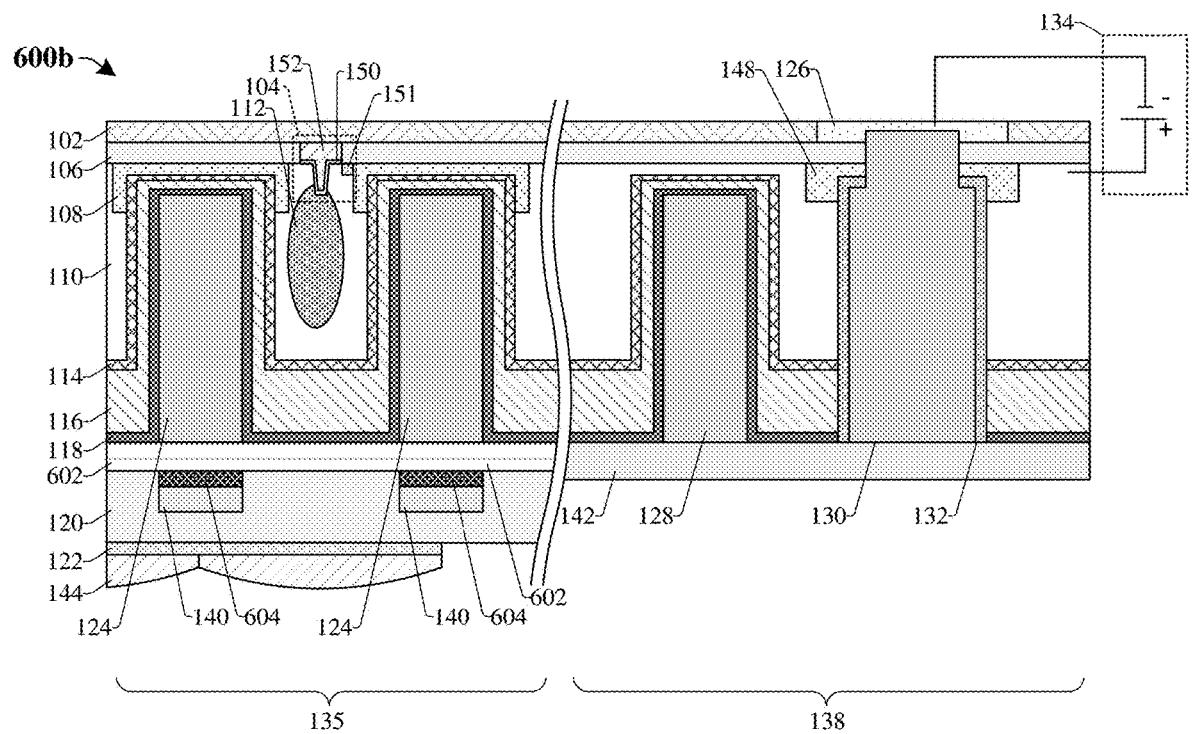
FIG. 6B illustrates a cross-sectional view of some embodiments of an image sensor including a separation layer and backside separation trace.
FIG. 7 illustrates a top view of some embodiments of the image sensor of FIG. 6A as indicated by cut-lines C-C' and D-D' of FIGS. 6A and 7.

FIG. 6B illustrates a cross-sectional view of some embodiments of an image sensor 600b including a separation layer 602 and backside separation trace 604. Image sensor 600a shows an alternative embodiment with regards to a separation layer 602 that separates a backside conductive trace 140 from a metal core 124, and a backside separation trace 604 that separates the backside conductive trace 140 from the metal core 124. Image sensor 600b shares the same description for all of the embodiments described in FIG. 1 except for the semiconductor substrate 110, the first dielectric liner 114, the third dielectric layer 116, the second dielectric liner 118, the backside conductive trace 140, the color filter layer 120, the separation layer 602, and the backside separation trace 604. Some features of FIG. 1 are omitted in FIG. 6B for ease of illustration.

In the image sensor 600b, the third dielectric layer protrudes into the semiconductor substrate 110 and separates the second dielectric liner 118 from the first dielectric liner 114 in both the pixel array region 135 and the peripheral region 138. A separation layer 602 is disposed along a backside surface of the metal core 124 and along a backside surface of the second dielectric liner 118 in a pixel array region 135. The separation layer 602 may, for example, be or comprise an oxide, a metal oxide, aluminum oxide, hafnium oxide, a high-k dielectric, a low-k dielectric, or the like. A color filter layer 120 is disposed along a backside of the separation layer 602 in the pixel region. A backside conductive trace 140 is disposed within the color filter layer 120 aligned with the metal core 124. A backside separation trace 604 is disposed along a backside of the separation layer 602 and separates the backside conductive trace 140 from the separation layer 602. The backside separation trace 604 may, for example, be or comprise aluminum, copper, aluminum copper, tungsten, titanium nitride, or the like. In some embodiments the metal core 124, the backside separation trace 604, and the backside conductive trace 140 comprise the same material. In other embodiments the metal core 124, the backside separation trace 604, and the backside conductive trace 140 comprise different materials. For example, the metal core 124 is aluminum copper, the backside separation trace 604 is titanium nitride, and the backside conductive trace 140 is tungsten.

FIG. 7 illustrates a top view 700 of some embodiments of the image sensor 600a of FIG. 6A as indicated by cut-lines C-C' and D-D' of FIGS. 6A and 7.

As seen in the top view 700, the metal core 124 is arranged as an isolation grid and the backside conductive trace 140 is arranged as a backside metal grid. For ease of illustration, the color filter layer 120 of FIG. 6A is omitted to show the separation layer 602 disposed along a front side surface of the backside metal grid.

Figure 8:
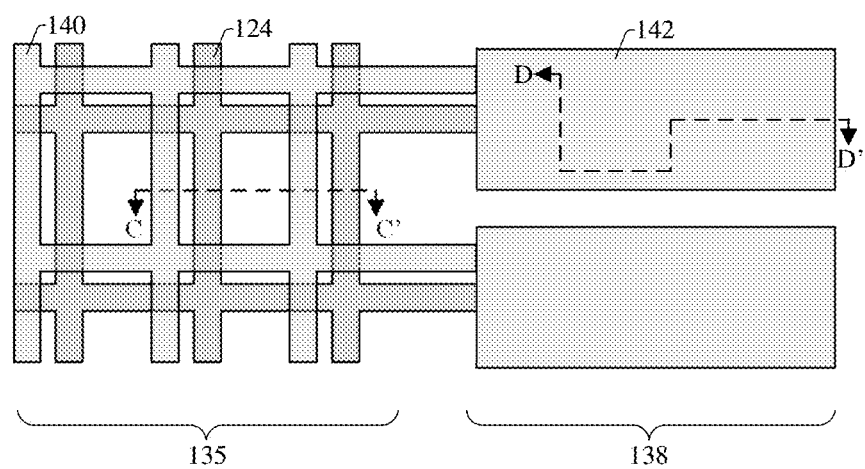
FIGS. 8 and 9 illustrate top views of alternative embodiments of the image sensors of FIGS. 1, 5, and 6 illustrating different possible offsets of the backside conductive trace relative to the metal core.
Figure 9:
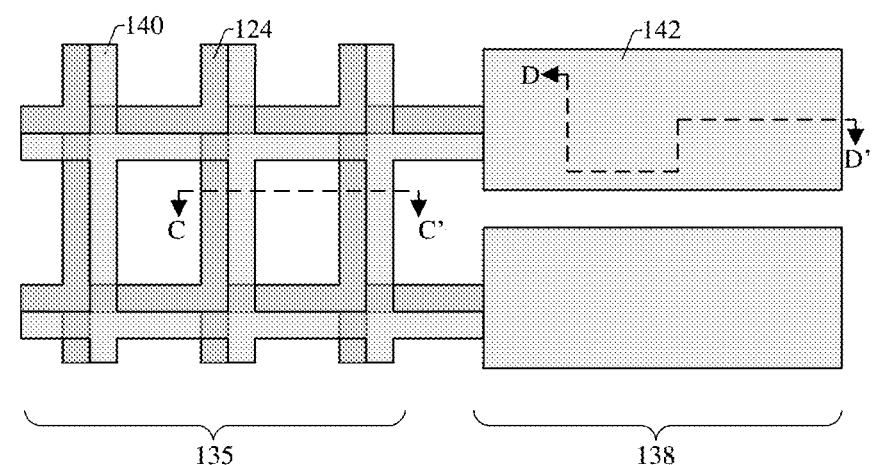

FIGS. 8 and 9 illustrate a top view 800 and a top view 900 respectively of alternative embodiments of the image sensors 100, 400a-400c, 600a, and 600b of FIGS. 1, 4A-4C, 6A, and 6B respectively illustrating different possible offsets of the backside conductive trace 140 relative to the metal core 124.

As seen in the top view 800 and top view 900, the metal core 124 is arranged as an isolation grid and the backside conductive trace 140 is arranged as a backside metal grid. For ease of illustration, the color filter layer 120 of FIG. 4A and the separation layer 602 of FIG. 6A is omitted to show the offset alignment of the backside conductive trace 140 relative to the metal core 124. In top view 800, vertical features of the backside metal grid are offset to the left of vertical features of the isolation grid, where there is a first gap between sidewalls of the vertical features of the backside metal grid and sidewalls of the vertical features of the isolation grid. Horizontal features of the backside metal grid are offset above horizontal features of the isolation grid, where there a second gap between sidewalls of the horizontal features of the backside metal grid and sidewalls of the horizontal features of the isolation grid.

In top view 900, vertical features of the backside metal grid are offset to the right of vertical features of the isolation grid and horizontal features of the backside metal grid are offset below vertical features of the isolation grid. Sidewalls of both the horizontal and vertical features of the backside metal grid overlap with sidewalls of both the horizontal and vertical features of the isolation grid.

Top view 800 and top view 900 are not limiting with regards to the offsets between the backside metal grid and isolation grid. In alternative embodiments (not illustrated), the backside metal grid can be offset relative to the isolation grid in other manners. For example, vertical features of the backside metal grid can be offset to the right or left of vertical features of the isolation grid. Also, horizontal features of the backside metal grid can be offset above or below horizontal features of the isolation grid. The backside metal grid may be aligned, overlapping, or separated by a gap relative to the isolation grid. Furthermore, relation of vertical and horizontal features, and offset of the backside metal grid relative to the isolation grid can depend on the spatial location amongst the backside metal grid and isolation grid. For example, at a center of the backside metal grid and isolation grid, a first offset may occur, and at a periphery of the backside metal grid and isolation grid, a second offset may occur. The first offset may be that depicted in FIG. 1 where the backside metal grid and isolation grid are aligned. The second offset may be that depicted in FIG. 8 where the sidewalls of the backside metal grid and sidewalls of the isolation grid are separated by a gap. Furthermore, different regions of the backside metal grid and isolation grid may include additional offset scenarios or combination of offset scenarios. The alternative embodiments of FIGS. 8 and 9 can occur as a result of registration differences during fabrication.

Figure 10:
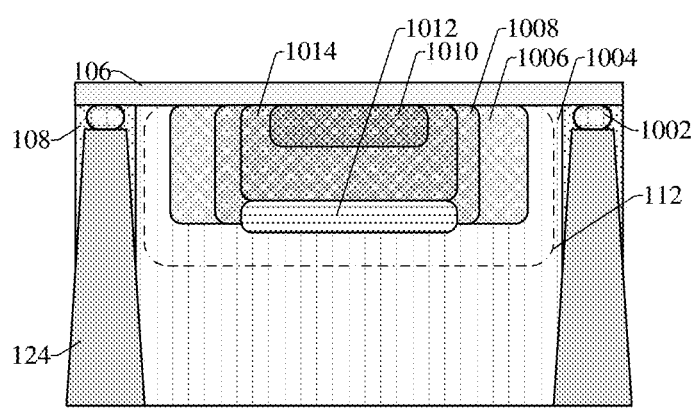
FIG. 10 illustrates a cross-sectional view of some embodiments of an image sensor including a detailed view of a photodetector.

FIG. 10 illustrates a cross-sectional view of some embodiments of an image sensor 1000 including a detailed view of a photodetector 112. Image sensor 1000 shares the same description for all the embodiments described in FIG. 1 except for alternative embodiments with regards to the photodetector 112, a metal core 124, and a STI structure 108.

In the image sensor 1000, a photodetector 112 is disposed under a backside of a second dielectric layer 106. The photodetector 112 may be configured as a single photon avalanche diode (SPAD). The SPAD can detect incident radiation with very low intensities (e.g., a single photon). In some embodiments, the SPAD may, for example, be used in a near IR (NIR) direct-time of flight (D-TOF) application.

The SPAD may include a first P-type doping region 1004 disposed on the backside of the second dielectric layer 106. The metal core extends into a backside of a semiconductor substrate (110 of FIG. 1), and laterally surrounds the first P-type doping region 1004. A P-type implant 1002 separates the metal core 124 from the second dielectric layer 106. The P-type implant 1002 recovers photo sensing functionality that may be lost due to fabrication processes in forming the metal core 124. A STI structure 108 laterally surrounds the P-type implant 1002 and portions of the metal core 124 and extends from a backside of the second dielectric layer 106.

The SPAD further includes a first N-type doping region 1010, a second N-type doping region 1014, a third N-type doping region 1008, a fourth N-type doping region 1006, and a second P-type doping region 1012. Doping regions 1010, 1014, 1008, 1006, 1012 are disposed under a backside of the second dielectric layer 106 and within the first P-type doping region 1004. The second N-type doping region 1014 surrounds lateral sidewalls and a backside of the first N-type doping region 1010. The second P-type doping region 1012 is disposed under a backside of the second N-type doping region 1014. The third N-type doping region 1008 surrounds lateral sidewalls of the second N-type doping region 1014 and lateral sidewalls of the second P-type doping region 1012. The fourth N-type doping region 1006 surrounds lateral sidewalls of the third N-type doping region 1008.

The N-type doping regions 1010, 1014, 1008, 1006 may comprise different doping concentrations. For example, a doping concentration of the first N-type doping region 1010 is higher than a doping concentration of the second N-type doping region 1014. The doping concentration of the second N-type doping region 1014 is higher than a doping concentration of the third N-type doping region 1008. The doping concentration of the third N-type doping region 1008 is higher than a doping concentration of the fourth N-type doping region 1006. The N-type doping regions 1010, 1014, 1008, 1006 may, for example, comprise a doping concentration ranging from $10^{10}$ to $10^{18}$ atoms/cm$^3$. A doping concentration of the second P-type doping region 1012 may be higher than a doping concentration of the first P-type doping region 1004. The P-type doping regions 1004, 1012 may, for example, comprise a doping concentration ranging from $10^{10}$ to $10^{15}$ atoms/cm$^3$.

Figure 11:
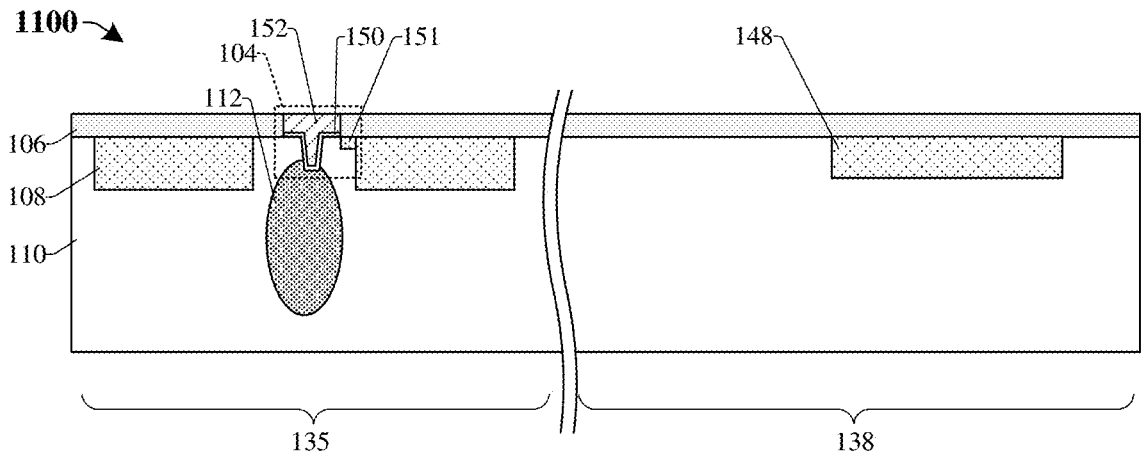
FIGS. 11-29 illustrate cross-sectional and top views of some embodiments of methods of forming an image sensor with a negative bias circuit coupled to a peripheral region configured to negatively bias a pixel array region.

FIGS. 11-29 illustrate cross-sectional and top views of some embodiments of methods of forming an image sensor with a negative bias circuit 134 coupled to a peripheral region 138 configured to negatively bias a pixel array region 135. Although the cross-sectional views 1100-2900 shown in FIGS. 11-2900 are described with reference to a method, it will be appreciated that the structures shown in FIGS. 11-29 are not limited to the method but rather may stand alone separate of the method. Furthermore, although FIGS. 11-29 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part. Also, alternative embodiments depicted in FIGS. 1-10 may be substituted for embodiments in FIGS. 11-29 although they may not be shown.

As shown in cross-sectional view 1100 of FIG. 11, a photodetector 112 is formed within a pixel array region 135 of a semiconductor substrate 110. A second dielectric layer 106 is formed over a top side of the semiconductor substrate 110. A semiconductor device 104 is formed within the second dielectric layer 106 and protrudes into a frontside of the semiconductor substrate 110, and couples to the photodetector 112. In some embodiments, the semiconductor substrate 110 comprises any type of semiconductor body (e.g., monocrystalline silicon/CMOS bulk, silicon-germanium (SeGe), silicon on insulator (SOI), etc.) and/or has a first doping type (e.g., p-type doping).

In some embodiments, the semiconductor device 104 may, for example, be a transfer transistor. A gate electrode 152 is disposed over a frontside of the semiconductor substrate 110, and a gate dielectric 150 separates the gate electrode 152 from the semiconductor substrate 110. The semiconductor device 104 may selectively form a conductive channel between the photodetector 112 and a source/drain region 151 corresponding to a floating diffusion node to transfer accumulated charge (e.g., via absorbing incident radiation) from the photodetector 112 to source/drain 151. In some embodiments, the gate electrode 152 may comprise, for example, polysilicon, aluminum, copper, or the like. In further embodiments, the gate dielectric 150 may comprise, for example, an oxide, a high-k dielectric, or the like.

A STI structure 108 is formed along a backside of the second dielectric layer 106 within the pixel array region 135 of the semiconductor substrate 110. The STI structure 108 is formed laterally surrounding the photodetector 112. A via STI structure 148 is formed along a backside of the second dielectric layer 106 and formed within a peripheral region 138 of the semiconductor substrate 110 that is laterally offset from the pixel array region 135. The STI structure 108 and the via STI structure 148 may, for example, be or comprise a dielectric material (e.g., silicon dioxide), a high-k dielectric, or the like.

Figure 12:
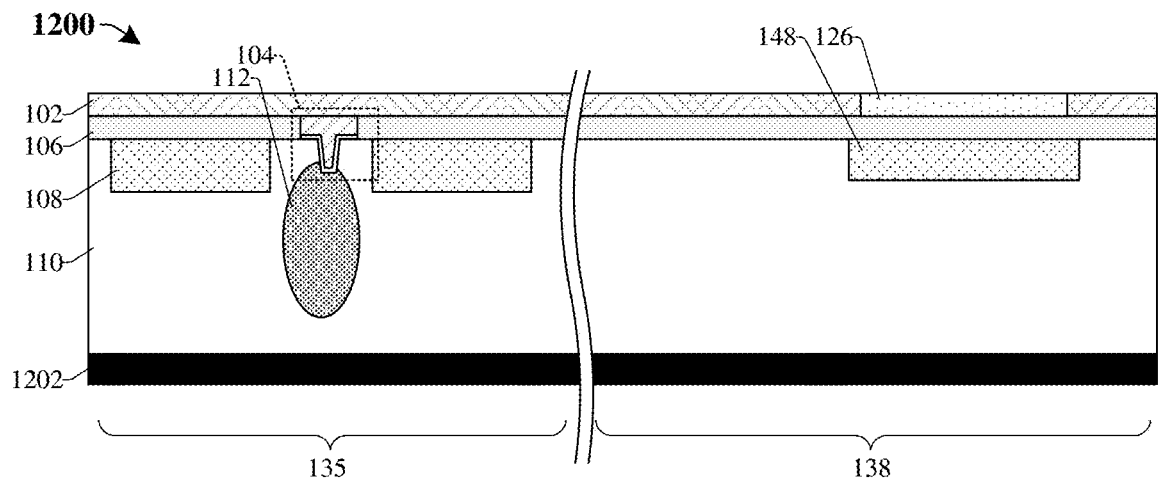

As shown in cross-sectional view 1200 of FIG. 12, a first dielectric layer 102 is deposited over a front side of the second dielectric layer 106. Some features of FIG. 11 are omitted in FIG. 12 for ease of illustration. In some embodiments, the first dielectric layer 102 may, for example, be deposited by a chemical vapor deposition (CVD), physical vapor deposition (PVD), atomic layer deposition (ALD) process, or another suitable growth or deposition process. The first dielectric layer 102 is patterned to define a conductive feature opening (not shown) within the first dielectric layer 102 over a topside of the via STI structure 148. A conductive material is deposited (e.g., by PVD, CVD, ALD, etc.) within the conductive feature opening forming a conductive feature 126. The conductive feature 126 may, for example, be or comprise aluminum, copper, aluminum copper, tungsten, or the like.

A hard mask layer 1202 is deposited on a backside of the semiconductor substrate 110. In some embodiments, the hard mask layer 1202 may, for example, be deposited by a PVD, CVD or ALD process and may be or comprise a silicon-based material, such as silicon nitride.

Figure 13:
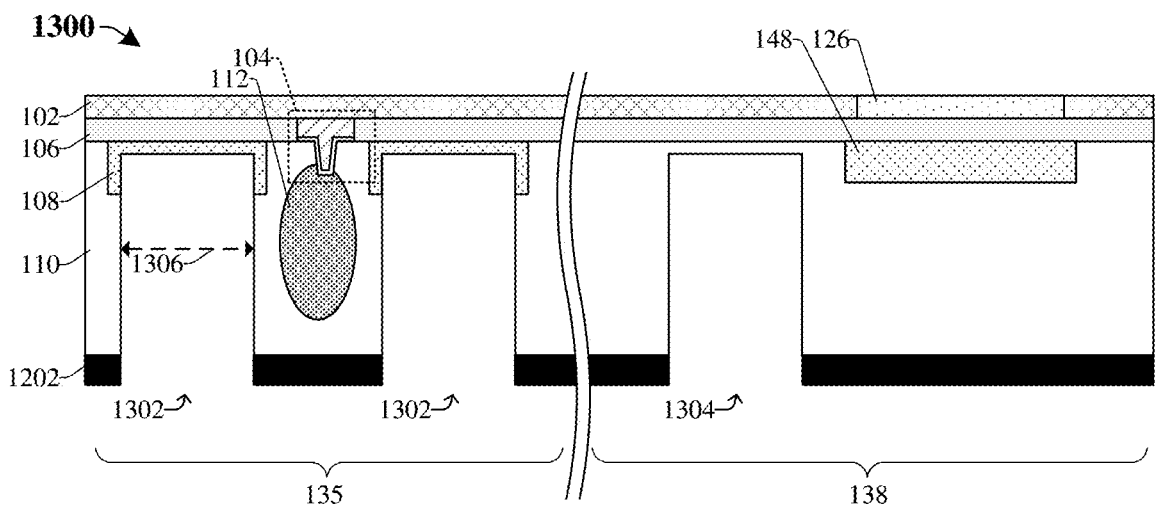

As shown in cross-sectional view 1300 of FIG. 13, a first patterning process is performed on the hard mask layer 1202 and the semiconductor substrate 110 forming cavity opening 1302 in the pixel array region 135 and cavity opening 1304 in the peripheral region 138. Cavity opening 1302 laterally surrounds the photodetector 112 and exposes sidewalls of the semiconductor substrate 110, a backside surface of the STI structure 108 and sidewalls of the vertical portions of the STI structure 108. A width 1306 of cavity opening 1302 may, for example, be about 0.12 micrometers (um), within a range of about 0.1 um to about 0.14 um, or another suitable value. Cavity opening 1304 is formed laterally offset from the via STI structure 148.

The patterning may, for example, comprise any of a photolithography process and an etching process. In some embodiments (not shown), a photoresist is formed over the hard mask layer (1202 of FIG. 12). The photoresist is patterned by an acceptable photolithography technique to develop an exposed photo resist. With the exposed photo resist in place, an etch is performed to transfer the pattern from the exposed photo resist to the underlying layers, for example, the semiconductor substrate 110 and hard mask layer 1202, to define cavity openings 1302, 1304. The etching process may comprise a wet etching process, a dry etching process, or some other suitable etching process.

Figure 14:
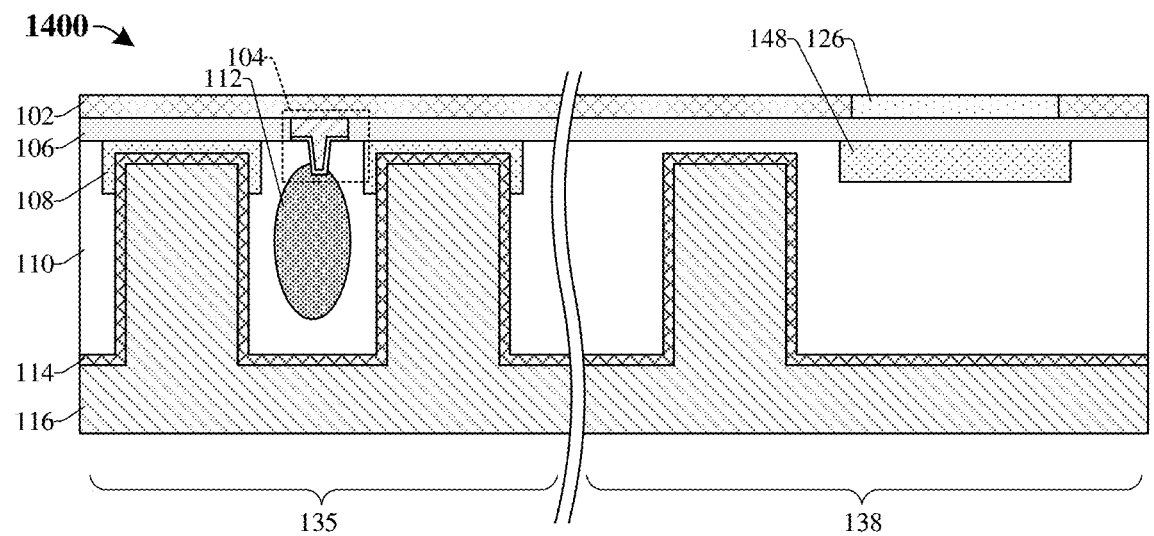

As shown in cross-sectional view 1400 of FIG. 14, the hard mask layer (1202 of FIG. 13) is removed. The hard mask layer (1202 of FIG. 13) may, for example, be removed through a chemical wash process, an etch process, a planarization process, an ashing process, or other suitable removal process. A first dielectric liner 114 is deposited along a backside surface of the semiconductor substrate 110, sidewalls of the semiconductor substrate 110 that are exposed by cavity openings (1302, 1304 of FIG. 13), sidewalls of the vertical portions of the STI structure 108, and a backside surface of the STI structure 108. A third dielectric layer 116 is deposited over a backside surface and sidewalls of the first dielectric liner 114. The first dielectric liner 114 may, for example, be or comprise an oxide, a metal oxide, aluminum oxide, hafnium oxide, a high-k dielectric, a low-k dielectric, or the like. In some embodiments, the first dielectric liner 114 may, for example, be deposited by a PVD, CVD, ALD, plasma-enhanced CVD (PECVD), plasma-enhanced ALD (PEALD) process, or other suitable process to a thickness of 100 to 250 angstroms. The first, second, and third dielectric layers 102, 106, 116 may, for example, be or comprise an oxide, such as silicon dioxide, tantalum oxide, a dielectric, a low-k dielectric, a high-k dielectric, another suitable oxide or dielectric. In some embodiments, third dielectric layer 116 may, for example, be deposited by a PVD, CVD, ALD process, or other suitable process.

Figure 15:
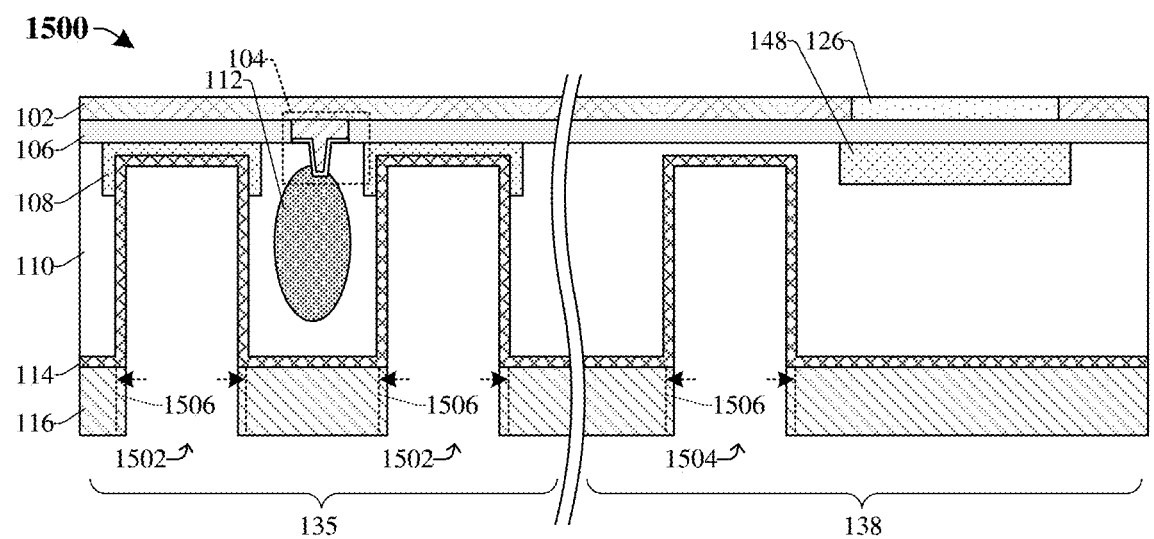

As shown in cross-sectional view 1500 of FIG. 15, a second etch process is performed on the third dielectric layer 116 forming cavity opening 1502 in the pixel array region 135 and cavity opening 1504 in the peripheral region 138. Cavity opening 1502 and cavity opening 1504 exposes a bottom side surface of the first dielectric liner 114, sidewalls of the first dielectric liner 114, and sidewalls of the third dielectric layer 116 in the pixel array region 135 and peripheral region 138. In some embodiments, the second etch process may include: 1) forming a hard mask (not shown) over the third dielectric layer 116; 2) exposing unmasked regions of the third dielectric layer 116 to one or more etchants until the backside surface of the first dielectric liner 114 is reached; and 3) performing a removal process to remove the masking layer. In some embodiments, the etch may include a wet etch process, a dry etch process, or another suitable etch process. In some embodiments, the opening cavity openings 1502 and 1504 in the third dielectric layer 116 may be wider than the inner sidewalls of the first dielectric liner 114 as shown by lines 1506, such that there is a lateral "step" between the inner sidewalls of the first dielectric liner 114 and the inner sidewalls of the third dielectric layer 116

Figure 16:
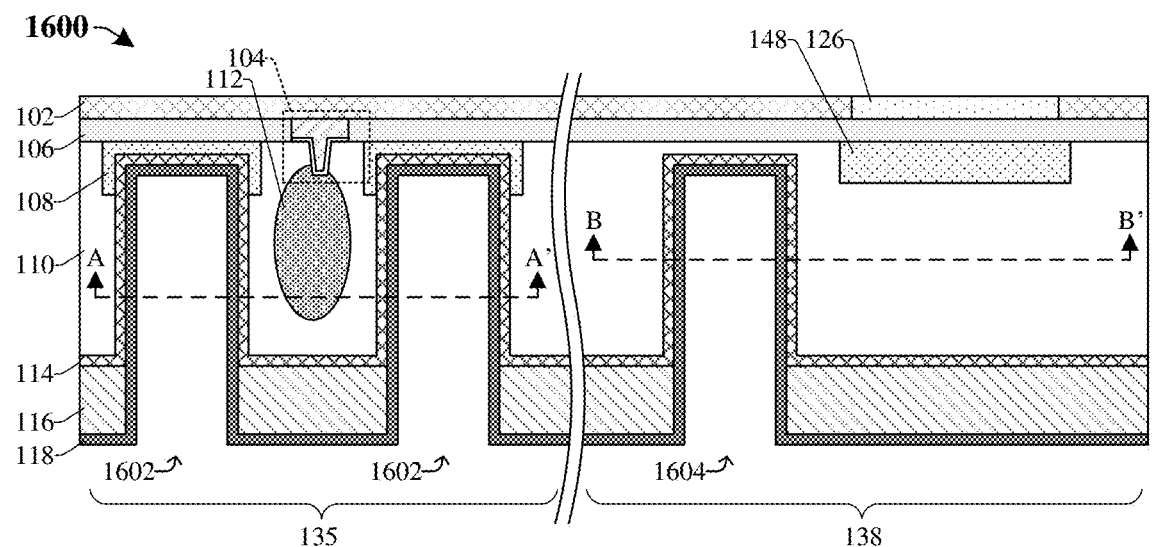

As shown in cross-sectional view 1600 of FIG. 16, a second dielectric liner 118 is deposited in both the pixel array region 135 and the peripheral region 138 over a backside surface of the third dielectric layer 116, along sidewalls of the third dielectric layer 116, along sidewalls of the first dielectric liner 114, and along a backside surface of the first dielectric liner 114. The second dielectric liner 118 is deposited in cavity openings (1502, 1504 of FIG. 15) creating a backside isolation trench 1602 in the pixel array region 135 and backside connecting trench 1604 in the peripheral region 138 bound by sidewalls of the second dielectric liner 118. Backside isolation trench 1602 and backside connecting trench 1604 extend through the third dielectric layer 116 and extend into the semiconductor substrate 110. The second dielectric liner 118 may, for example, be or comprise an oxide, a metal oxide, aluminum oxide, hafnium oxide, a high-k dielectric, a low-k dielectric, or the like. In some embodiments, the second dielectric liner 118 may, for example, be deposited by a PVD, CVD, ALD, PECVD, PEALD process, or other suitable process with a thickness of about 200 angstroms, within a range of about 150 to 250 angstroms, or another suitable value.

Figure 17:
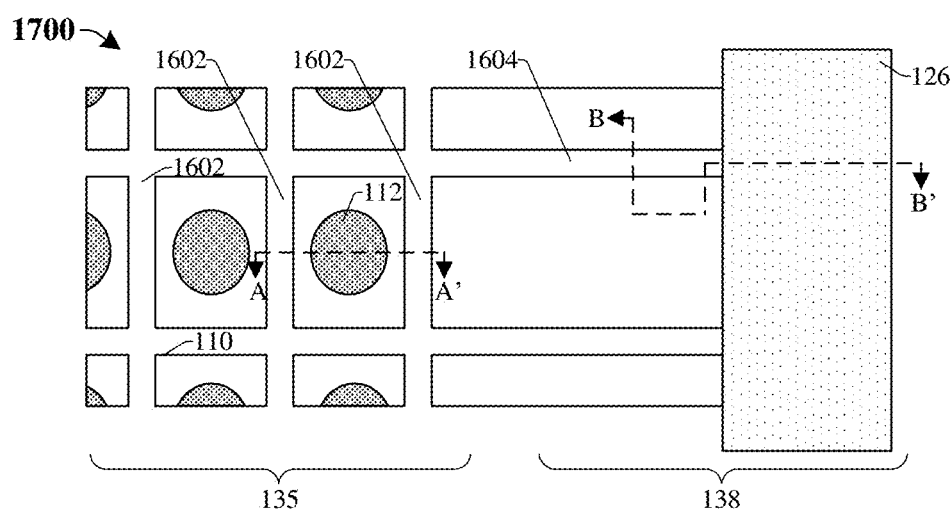

FIG. 17 illustrates a top view 1700 of some embodiments of the cross-sectional view 1600 of FIG. 16 as indicated by cut-lines A-A' and B-B' in FIGS. 16 and 17. Some features of FIG. 16 are omitted in FIG. 17 for ease of illustration.

As seen in the top view 1700, the backside isolation trench 1602 is arranged as a backside isolation trench grid 1602 such that the backside isolation trench 1602 and backside connecting trench 1604 intersect. Photodetectors 112 are disposed within the semiconductor substrate 110 and between sidewalls of the semiconductor substrate 110. The photodetectors 112 are configured to convert electromagnetic radiation (e.g., photons) into electrical signals. For example, the photodetectors 112 may generate electron-hole pairs from the electromagnetic radiation. The photodetectors 112 comprise a second doping type (e.g., n-type doping) opposite the first doping type. In some embodiments, the first doping type is p-type and the second doping type is n-type, or vice versa.

Figure 18:
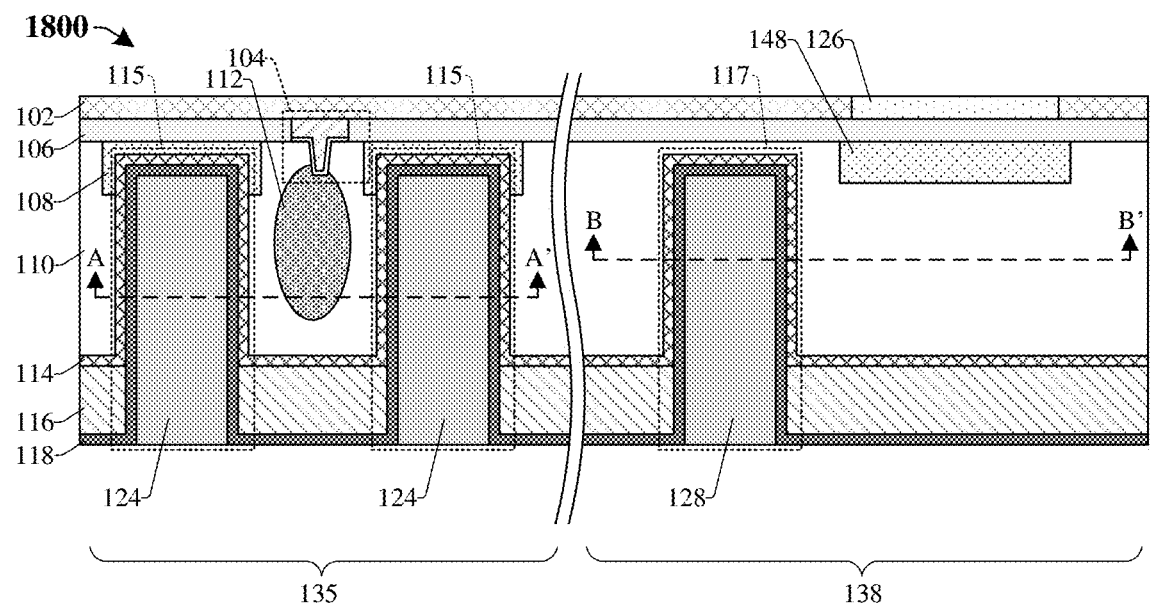

As shown in cross-sectional view 1800 of FIG. 18, backside isolation trench (1602 of FIGS. 16 and 17) and the backside connecting trench (1604 of FIGS. 16 and 17) are filled forming a metal core 124 and a connecting metal core 128. Forming the metal core 124 and the connecting metal core 128 may, for example, include: 1) depositing a first conductive layer (not shown) covering a backside surface of the second dielectric liner 118, and sidewalls of the second dielectric liner 118 filling the backside isolation trench (1602 of FIGS. 16 and 17) and the backside connecting trench (1604 of FIGS. 16 and 17); and 2) removing a portion of the first conductive layer (not shown) level with the backside surface of the second dielectric liner 118. Removing the portion of the first conductive layer (not shown) may, for example, be removal through a chemical wash process, an etch process, a planarization process, or other suitable removal process. The metal core 124 and the connecting metal core 128 may, for example, be or comprise aluminum, copper, aluminum copper, tungsten, or the like. The first dielectric liner 114, the metal core 124, and the second dielectric liner 118 form a backside isolation structure 115 that extend into a backside of the semiconductor substrate 110 and laterally surrounds the pixel array region 135. The first dielectric liner 114, the second dielectric liner 118, and the connecting metal core 128 form a backside connecting structure 117, that couples to backside isolation structure 115 and extends from the pixel array region 135 to the peripheral region 138.

Figure 19:
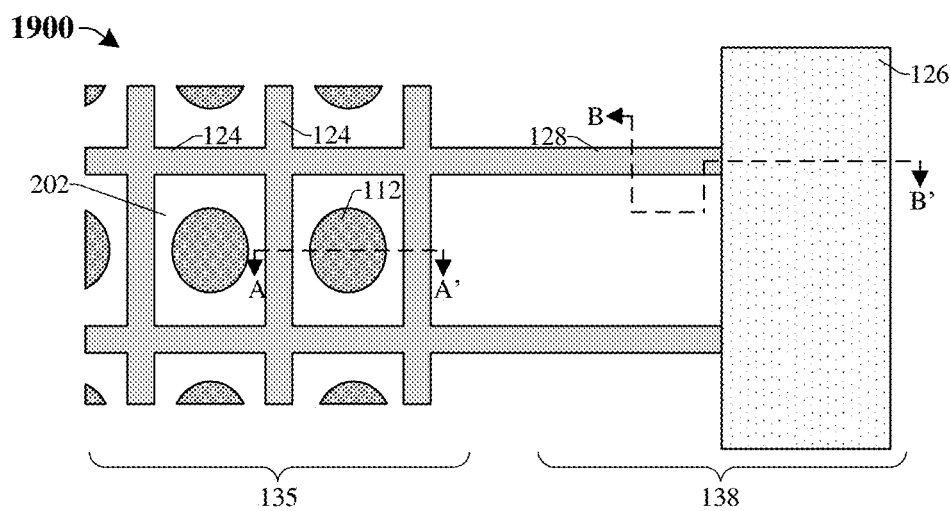

FIG. 19 illustrates a top view 1900 of some embodiments of the cross-sectional view 1800 of FIG. 18 as indicated by cut-lines A-A' and B-B' in FIGS. 18 and 19.

As seen in the top view 1900, the metal core 124 is arranged as an isolation grid. The isolation grid is made up of square-shaped or ring-shaped grid segments whose outer edges adjoin one another to make up the isolation grid. Photodetectors 112 are disposed within the semiconductor substrate 110 (see FIG. 18) and between sidewalls of the metal core 124 that create an isolation cell 202. Connecting metal core 128 is formed extending from the isolation grid in the pixel array region 135 to the peripheral region 138.

Figure 20:
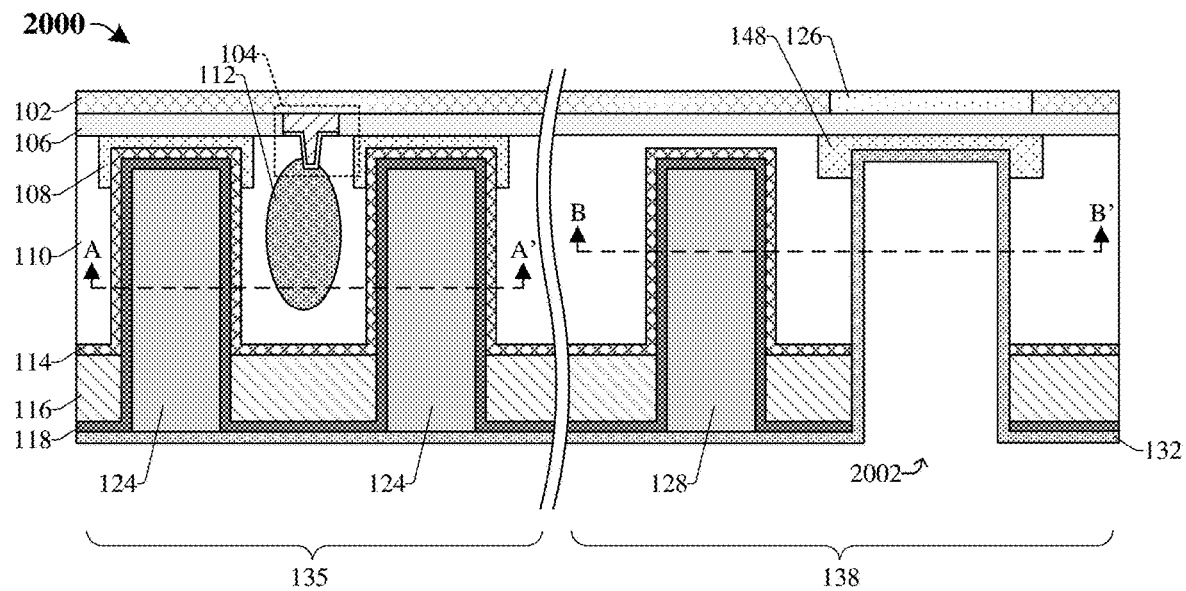

As shown in cross-sectional view 2000 of FIG. 20, a third etch process is performed on the second dielectric liner 118, the third dielectric layer 116, the first dielectric liner 114, the semiconductor substrate 110, and the via STI structure 148 forming via cavity opening 2002. In some embodiments, the third etch process may include: 1) forming a hard mask (not shown) over a backside surface of the second dielectric liner 118 and a backside surface of both the metal core 124 and the connecting metal core 128; 2) exposing unmasked regions of the second dielectric liner 118 and underlying layers to one or more etchants until the one or more etchants etch into the via STI structure 148 and a backside surface of the via STI structure 148 is reached; and 3) performing a removal process to remove the masking layer. In some embodiments, the third etch may include a wet etch process, a dry etch process, or another suitable etch process.

A through dielectric liner 132 is deposited along the backside surface of the second dielectric liner 118 and the backside surface of both the metal core 124 and the connecting metal core. The through dielectric liner 132 is further deposited along sidewalls of the second dielectric liner 118, the third dielectric layer 116, the first dielectric liner 114, the semiconductor substrate 110, and the via STI structure 148 in the via cavity opening 2002. The through dielectric liner 132 is also deposited along the backside surface of the via STI structure 148. The through dielectric liner 132 may, for example, be or comprise an oxide, a metal oxide, aluminum oxide, hafnium oxide, a high-k dielectric, a low-k dielectric, or the like.

Figure 21:
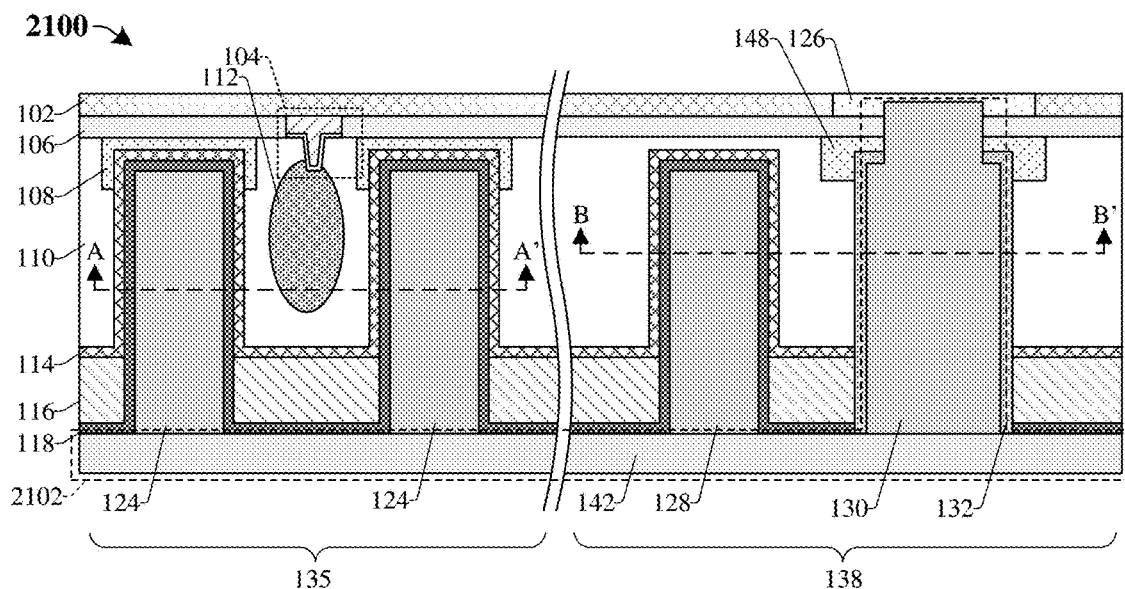

As shown in cross-sectional view 2100 of FIG. 21, a fourth etch is performed to remove a portion of the through dielectric liner 132 from the backside surface of the second dielectric liner 118, and etch through the dielectric liner 132, the via STI structure 148, the second dielectric layer 106, and into the conductive feature 126 thereby exposing a backside surface of the conductive feature 126. In some embodiments, the fourth etch may include: 1) forming a first hard mask (not shown) over sidewalls of the through dielectric liner 132 in the via cavity opening (2002 of FIG. 20); 2) exposing the unmasked regions of the through dielectric liner 132 to one or more etchants until the backside surface of the second dielectric liner 118, the metal core 124, connecting metal core 128; and the via STI structure are reached; 3) forming a second hard mask (not shown) over the backside surface of the second dielectric liner 118, the metal core 124, and connecting metal core 128, such that the backside surface of the via STI structure 148 is exposed; 4)

exposing the unmasked region of the backside surface of the via STI structure 148 and underlying layers to one or more etchants until a backside surface of the conductive feature 126 is reached; and 5) performing a removal process to remove the first masking layer (not shown) and the second masking layer (not shown).

After completing the fourth etch, a second conductive layer 2102 is deposited over the backside surface of the second dielectric liner 118, the metal core 124, and the connecting metal core 128. The second conductive layer 2102 is further deposited filling the via cavity opening (2002 of FIG. 20) and covering sidewalls of the through dielectric liner 132, the via STI structure 148, the second dielectric layer 106, the conductive feature 126, and covering a backside surface of the conductive feature 126. In some embodiments, the second conductive layer 2102 may, for example, be deposited by a PVD, CVD, ALD, process, or other suitable process. The second conductive layer 2102 may, for example, be or comprise aluminum, copper, aluminum copper, tungsten, or the like. In some embodiments, the second conductive layer 2102 consists essentially of aluminum. In other embodiments, the second conductive layer 2102 consists essentially of tungsten. Furthermore, the second conductive layer 2102 forms a through substrate via 130 in the via cavity opening (2002 of FIG. 20) and a conductive bridge 142 in the peripheral region 138 over a backside surface of the second dielectric liner 118 and the connecting metal core 128 where the conductive bridge 142 electrically couples the connecting metal core 128 to the through substrate via 130.

Figure 22:
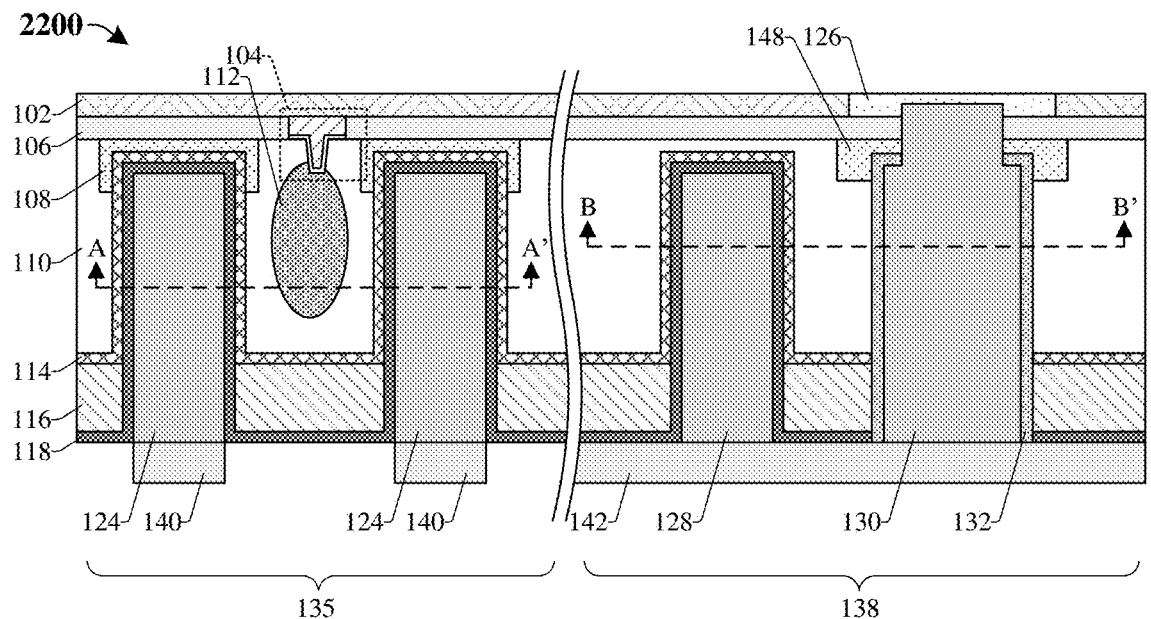

As shown in cross-sectional view 2200 of FIG. 22, a fifth etch process is performed to form a backside conductive trace 140 in the pixel array region 135 where the backside conductive trace 140 extends over a backside surface of the metal core 124 and between sidewalls of the metal core 124. In some embodiments, the fifth etch process includes: 1) forming a masking layer (not shown) over the second conductive layer 2102 where sidewalls of an unmasked region are aligned with sidewalls of the metal core 124 in the pixel array region 135 and forming the masking layer (not shown) over conductive bridge 142 in the peripheral region 138; 2) exposing unmasked regions of the second conductive layer 2102 to one or more etchants until a backside surface of the second dielectric liner 118 is reached; and 3) performing a removal process to remove the masking layer. In some embodiments, the fifth etch process may include performing a wet etch, a dry etch, or another suitable etch process. In completion of the fifth etch process, a center of the backside conductive trace 140 is aligned with a center of the metal core 124.

Figure 23:
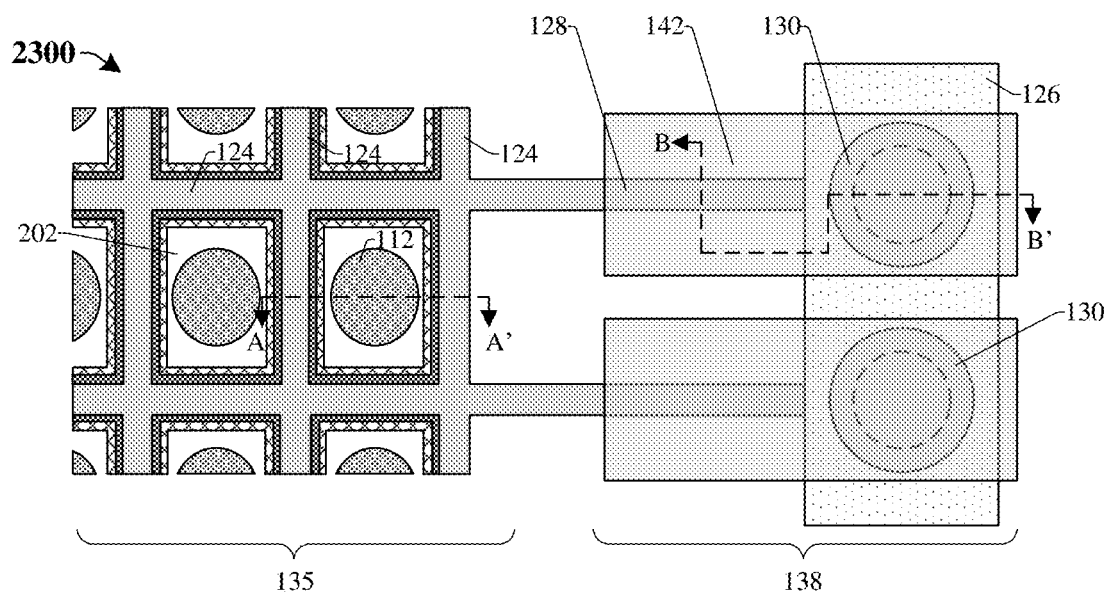

FIG. 23 illustrates a top view 2300 of some embodiments of the cross-sectional view 2200 of FIG. 22 as indicated by cut-lines A-A' and B-B' in FIGS. 22 and 23. As seen in the top view 2300, the conductive bridge 142 is formed over the backside of the through substrate via 130, over the backside of the connecting metal core, and extends perpendicularly from the conductive feature 126. A plurality of through substrate vias 130 are formed electrically coupled to the metal core 124 through the connecting metal core 128 and the conductive bridge 142. Furthermore, the plurality of through substrate vias 130 are formed electrically coupled to the conductive feature 126.

Figure 24:
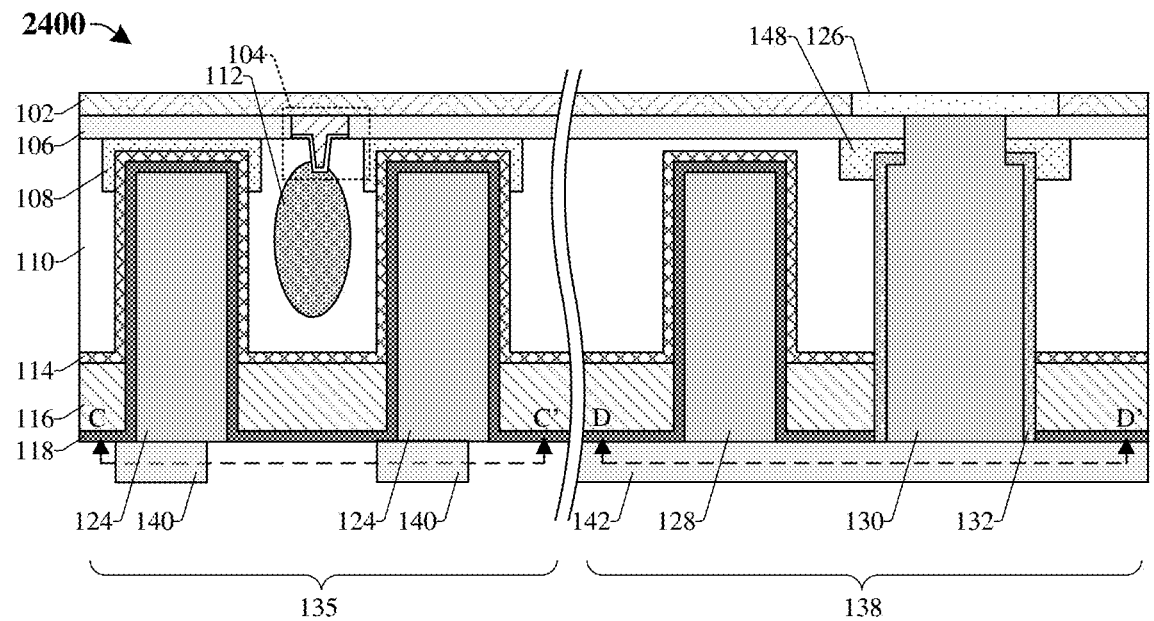

Cross-sectional view 2400 of FIG. 24 shows an alternative embodiment of cross-sectional view 2200 of FIG. 22, forming an alternative offset between the metal core 124 and the connecting metal core 128. FIG. 24 is preceded by FIG. 21 in the method.

As shown in cross-sectional view 2400 of FIG. 24, a fifth etch process is performed to form a backside conductive trace 140 in the pixel array region 135 where the backside conductive trace 140 extends over a backside surface of the metal core 124 and a backside surface of the second dielectric liner 118 such that a center of the backside conductive trace 140 is offset from a center of the metal core 124. In some embodiments, the fifth etch process includes: 1) forming a masking layer (not shown) over the second conductive layer 2102 where sidewalls of an unmasked region are over the metal core 124 and the second dielectric liner 118 in the pixel array region 135; and forming the masking layer (not shown) over a second portion of the second conductive layer 142 in the peripheral region 138; 2) exposing unmasked regions of the second conductive layer 2102 to one or more etchants until a backside surface of the second dielectric liner 118 and the metal core 124 are reached; and 3) performing a removal process to remove the masking layer. In some embodiments, the fifth etch process may include performing a wet etch, a dry etch, or another suitable etch process. In completion of the fifth etch process, a center of the backside conductive trace 140 is laterally offset from a center of the metal core 124, and a conductive bridge 142 is present in the peripheral region 138.

Figure 25:
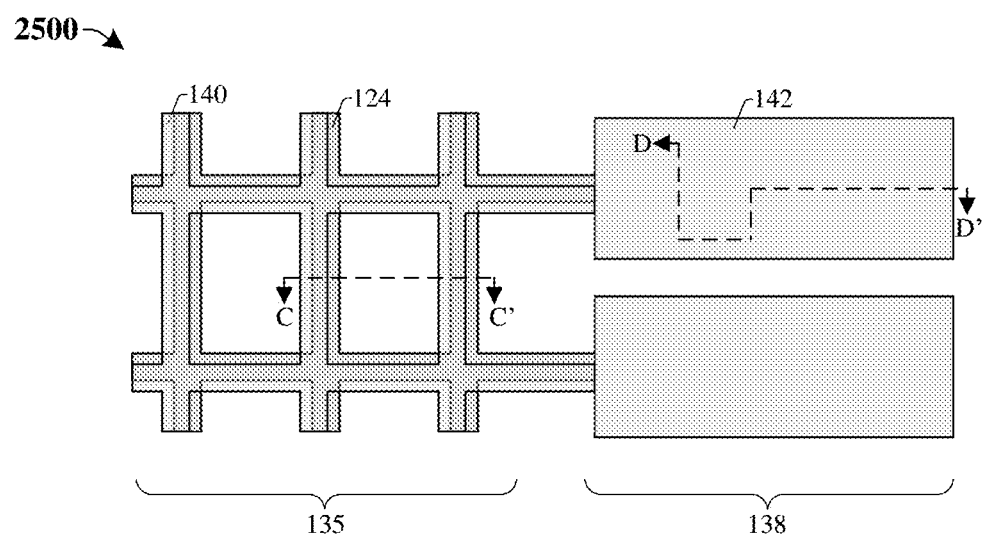

FIG. 25 illustrates a top view 2500 of some embodiments of the cross-sectional view 2400 of FIG. 24 as indicated by cut-lines C-C' and D-D' in FIGS. 24 and 25.

As seen in the top view 2500, the metal core 124 is formed as an isolation grid and the backside conductive trace 140 is formed as a backside metal grid. Vertical features of the backside metal grid are formed offset to the left of vertical features of the isolation grid. Horizontal features of the backside metal grid are offset below horizontal features of the isolation grid.

Figure 26:
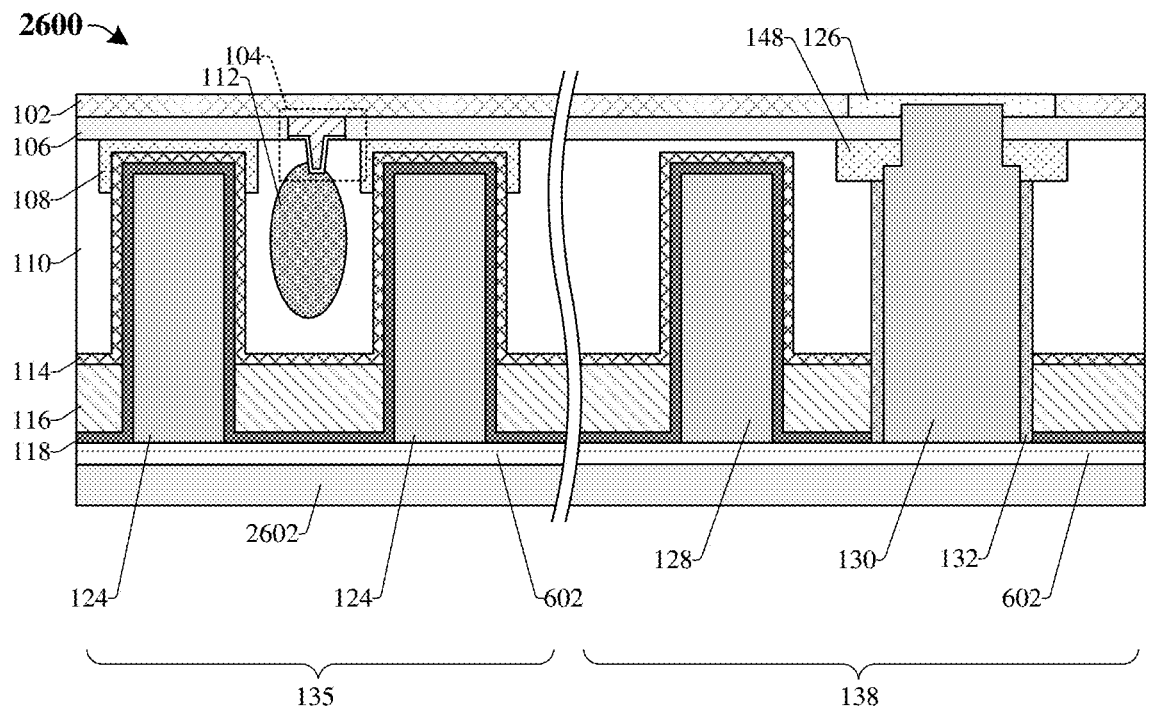

Cross-sectional view 2600 of FIG. 26 shows an alternative embodiment of cross-sectional view 2100 of FIG. 21, showing a separation layer 602 formed over a backside of the second dielectric liner 118. FIG. 26 is preceded by FIG. 20 in the method.

As shown in cross-sectional view 2600 of FIG. 26, a fourth etch is performed to remove a portion of the through dielectric liner 132 from the backside surface of the second dielectric liner 118, and etch through the dielectric liner 132, the via STI structure 148, the second dielectric layer 106, and into the conductive feature 126 thereby exposing a backside surface of the conductive feature 126. The fourth etch includes the same fourth etch steps as described in FIG. 21. After completing the fourth etch, a through substrate via 130 is deposited filling the via cavity opening (2002 of FIG. 20) and covering sidewalls of the through dielectric liner 132, the via STI structure 148, the conductive feature 126, and covering a backside surface of the conductive feature 126. The through substrate via 130 may, for example, be or comprise aluminum, copper, aluminum copper, tungsten, or the like. In some embodiments, the through substrate via 130 may, for example, be deposited by a PVD, CVD, ALD, process, or other suitable process.

A separation layer 602 is deposited over the backside surface of the second dielectric liner 118, the metal core 124, the connecting metal core 128, through dielectric liner 132, and the through substrate via 130. The separation layer 602 may, for example, be or comprise an oxide, a metal oxide, aluminum oxide, hafnium oxide, a high-k dielectric, a low-k dielectric, or the like. In some embodiments, the separation layer 602 may, for example, be deposited by a PVD, CVD, ALD, process, or other suitable process to a thickness of 400 to 600 angstroms. A conductive trace layer 2602 is deposited on a backside surface of the separation layer 602 in both the pixel array region 135 and the peripheral region 138. The conductive trace layer 2602 may, for example, be or comprise aluminum, copper, aluminum copper, tungsten, or the like. In some embodiments, the conductive trace layer 2602 consists essentially of aluminum. In other embodiments, the conductive trace layer 2602 consists essentially of tungsten.

Figure 27:
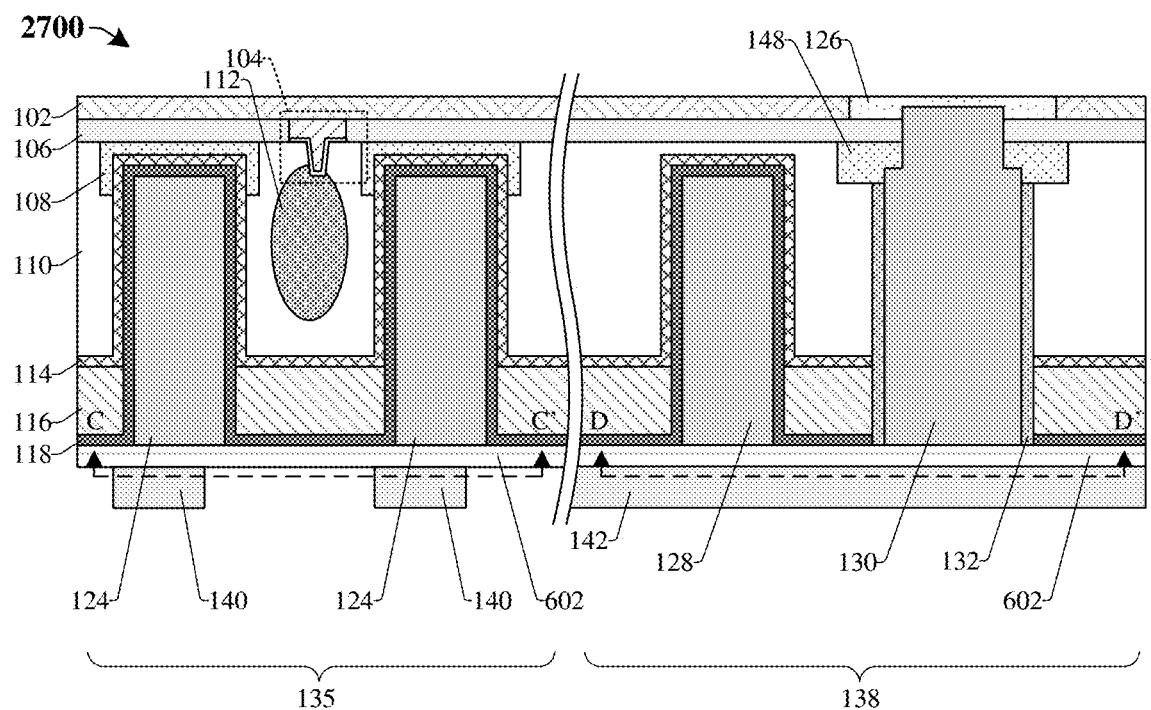

Cross-sectional view 2700 of FIG. 27 shows an alternative embodiment of cross-sectional views 2200 and 2400 of FIGS. 22 and 24, forming an offset between the metal core 124 and the connecting metal core 128 separated from the second dielectric liner 118 by the separation layer. FIG. 27 is preceded by FIG. 26 in the method flow.

As shown in cross-sectional view 2700 of FIG. 27, a fifth etch process is performed to form a backside conductive trace 140 in the pixel array region 135 where the backside conductive trace 140 extends over the metal core 124 and the second dielectric liner 118 such that a center of the backside conductive trace 140 is offset from a center of the metal core 124. In some embodiments, the fifth etch process includes: 1) forming a masking layer (not shown) over a first portion of the conductive trace layer (2602 of FIG. 26) in the pixel array region 135 and the peripheral region 138, where sidewalls of an unmasked region are underlying the metal core 124 and the second dielectric liner 118; 2) exposing unmasked regions of the conductive trace layer (2602 of FIG. 26) to one or more etchants until a backside surface of the separation layer 602 is reached; and 3) performing a removal process to remove the masking layer. In some embodiments, the Fifth etch process may include performing a wet etch, a dry etch, or another suitable etch process. In completion of the fifth etch process, a center of the backside conductive trace 140 is laterally offset from a center of the metal core 124 and a conductive bridge 142 is formed along a backside surface of the separation layer 602 in the peripheral region 138.

Figure 28:
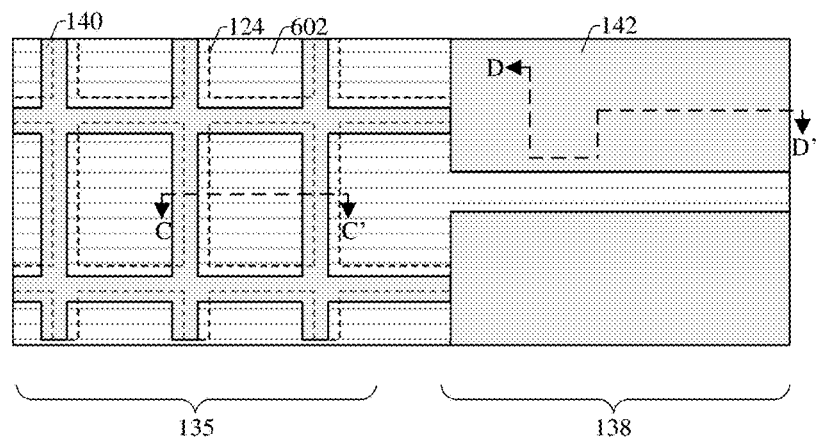

FIG. 28 illustrates a top view 2800 of some embodiments of the cross-sectional view 2700 of FIG. 27 as indicated by cut-lines C-C' and D-D' of FIGS. 27 and 28. As seen in the top view 2800, the metal core 124 is arranged as an isolation grid and the backside conductive trace 140 is arranged as a backside metal grid. Vertical features of the backside metal grid are formed offset to the left of vertical features of the isolation grid. Horizontal features of the backside metal grid are offset above horizontal features of the isolation grid.

Alternative embodiments of FIGS. 24-28 are not limiting with regard to the offsets between the backside metal grid and isolation grid. The backside metal grid and isolation grid may be formed to reflect the features discussed in FIGS. 4-9. In alternative embodiments (not illustrated), the backside metal grid can be formed offset relative to the isolation grid in other manners. For example, vertical features of the backside metal grid can be formed offset to the right or left of vertical features of the isolation grid. Also, horizontal features of the backside metal grid can be formed offset above or below horizontal features of the isolation grid. The backside metal grid may be formed aligned, overlapping, or separated by a gap relative to the isolation grid. Furthermore, relation of vertical and horizontal features, and offset of the backside metal grid relative to the isolation grid can depend on the spatial location amongst the backside metal grid and isolation grid. For example, at a center of the backside metal grid and isolation grid, a first offset may occur, and at a periphery of the backside metal grid and isolation grid, a second offset may occur. The first offset may be that depicted in FIG. 22 where the backside metal grid and isolation grid are aligned. The second offset may be that depicted in any of FIG. 8-9, 24, or 27. Furthermore, different regions of the backside metal grid and isolation grid may include additional offset scenarios or combination of offset scenarios. The alternative embodiments of FIGS. 24-28 can occur as a result of registration differences during fabrication.

Figure 29:
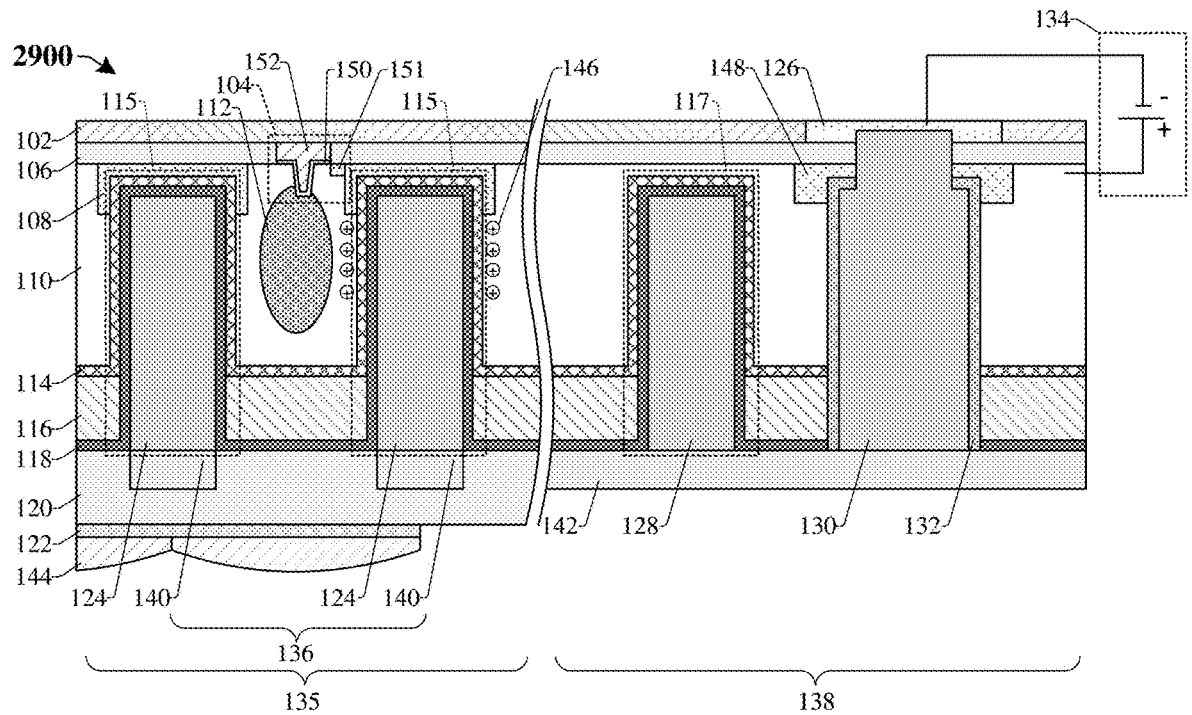

Cross-sectional view 2900 of FIG. 29 is preceded by cross-sectional view 2200 of FIG. 22 and cross-sectional view 2900 shows forming a color filter layer 120, fourth dielectric layer 122, and a plurality of micro-lenses 144 in the pixel array region 135, as well as a negative bias circuit 134.

As shown in cross-sectional view 2900 of FIG. 29, a color filter layer 120 is deposited over a backside surface of the backside conductive trace 140 and the second dielectric liner, and sidewalls of the backside conductive trace 140 in the pixel array region 135. The color filter layer 120 may, for example, comprise a dye-based or pigment based polymer or resin for filtering a specified wavelength of incoming radiation corresponding to a color spectrum (e.g. red, green, blue), or a material that allows for the transmission of the electromagnetic radiation having a specific range of frequencies, while electromagnetic radiation of frequencies outside of the specified range of frequencies. A fourth dielectric layer 122 is deposited over a backside surface of the color filter layer 120 and a plurality of micro-lenses 144 are formed on a backside surface of the fourth dielectric layer 122. As such, the plurality of micro-lenses 144 and underlying structures form the pixel array region 135 including at least one pixel region 136. The fourth dielectric layer 122 may, for example, be a bulk substrate (e.g., a bulk silicon substrate), a SOI substrate, or some other suitable substrate. The plurality of micro-lenses may, for example, be a micro-lens material. The color filter layer 120, fourth dielectric layer 122, and the plurality of micro-lenses 144 may be formed by a combination of deposition and etching processes.

A negative bias circuit 134 is formed electrically coupled to the conductive feature 126 and the semiconductor substrate 110 where the negative bias circuit is configured to apply a negative bias to the metal core 124 by way of the conductive feature 126, the through substrate via 130, and the connecting metal core 128. A number of electron holes 146 may be disposed within the semiconductor substrate 110 adjacent to the backside isolation structure 115. The negative bias circuit 134 is configured, during a negative bias state, to apply a negative bias to the metal core 124 to reduce the number of electron holes 146 relative to a no bias state. As a result of the negative bias circuit 134 configured to apply a negative bias to the metal core 124, the cross-talk between neighboring photodetectors 112 is reduced, and the quantum efficiency of the photodetectors 112 is increased. As such, the sensing performance of the image sensor 100 is improved and the reliability and/or accuracy of images produced from the image sensor 100 is improved.

Figure 30:
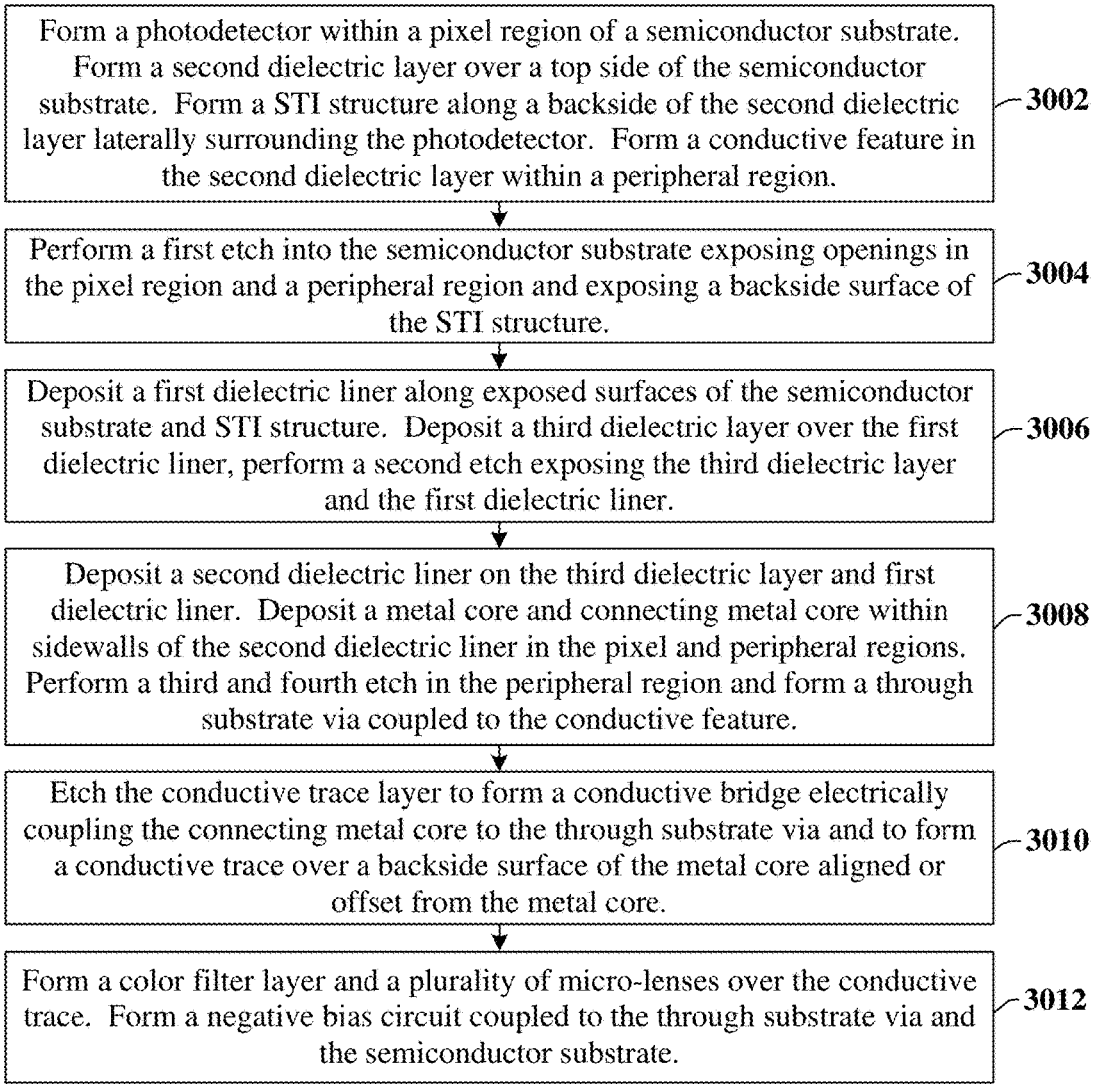
FIG. 30 illustrates a flow diagram of some embodiments of a method for forming an image sensor including a negative bias circuit coupled to a peripheral region configured to negatively biases a pixel array region.

FIG. 30 illustrates a flow diagram of some embodiments of a method 3000 for forming an image sensor including a negative bias circuit coupled to a peripheral region configured to negatively biases a pixel region.

At act 3002, a photodetector is formed within a pixel region of a semiconductor substrate. A second dielectric layer is formed over a top side of the semiconductor substrate. A STI structure is formed along a backside of the second dielectric layer laterally surrounding the photodetector 112. A conductive feature is formed within the second dielectric layer in a peripheral of the image sensor. FIG. 11 illustrates cross-sectional view 1100 corresponding to some embodiments of act 3002.

At act 3004, a first etch is performed into the semiconductor substrate exposing openings in the pixel region and the peripheral region of the semiconductor substrate. The etch exposing a backside surface of the STI structure in the pixel region. FIGS. 12 and 13 illustrate cross-sectional views 1200 and 1300 respectively corresponding to some embodiments of act 3004.

At act 3006, a first dielectric liner is deposited along exposed surfaces of the semiconductor substrate and STI structure. A third dielectric layer is deposited over a backside surface of the first dielectric liner and filling openings created by the first etch. A second etch is performed exposing sidewalls of the third dielectric layer and the first dielectric liner within the semiconductor substrate. FIGS. 14 and 15 illustrate cross-sectional views 1400 and 1500 respectively corresponding to some embodiments of act 3006.

At act 3008, deposit a second dielectric liner along surface of the third dielectric layer and the first dielectric liner in openings created by the second etch. Deposit a metal core and connecting metal core within sidewalls of the second dielectric liner in the pixel and peripheral regions. Perform a third and fourth etch in the peripheral region and form a through substrate via coupled to the conductive feature in the peripheral region. Deposit a conductive trace layer on a backside of the metal core, second dielectric layer, connecting metal core, and through substrate via. FIGS. 16 through 21 illustrate cross-sectional views 1600 and 2100 respectively corresponding to some embodiments of act 3008.

At act 3010, etch the conductive trace layer to form a conductive bridge in the peripheral region that electrically couples the connecting metal core to the through substrate via and a conductive trace in the pixel region over a backside surface of the metal core aligned or offset from the metal core. FIGS. 22 through 28 illustrate cross-sectional views 2200 through 2800 respectively corresponding to some embodiments of act 3010.

At act 3012, form a color filter layer and a plurality of micro-lenses over the conductive trace. Form a negative bias circuit coupled to the through substrate via and the semiconductor substrate. FIG. 29 illustrates cross-sectional view 2900 corresponding to some embodiments of act 3012.

Although the method 3000 is illustrated and/or described as a series of acts or events, it will be appreciated that the method 3000 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Some embodiments relate to an image sensor. The image sensor includes a semiconductor substrate including a pixel region and a peripheral region. A backside isolation structure extends into a backside of the semiconductor substrate and laterally surrounds the pixel region. The backside isolation structure includes a metal core, and a dielectric liner separates the metal core from the semiconductor substrate. A conductive feature is disposed over a front side of the semiconductor substrate. A through substrate via extends from the backside of the semiconductor substrate through the peripheral region to contact the conductive feature. The through substrate via is laterally offset from the backside isolation structure. A conductive bridge is disposed beneath the backside of the semiconductor substrate and electrically couples the metal core of the backside isolation structure to the through substrate via.

An image sensor includes a semiconductor substrate including a pixel region laterally offset from a peripheral region. A backside isolation structure extends into a backside of the semiconductor substrate and laterally surrounds the pixel region. A through substrate via extends through the semiconductor substrate in the peripheral region and is electrically coupled to the backside isolation structure by a conductive bridge disposed beneath the backside of the semiconductor substrate. A conductive feature is disposed over a front side of the semiconductor substrate and is electrically coupled to the through substrate via. A negative bias circuit is configured to apply a first bias state and a second bias state at different times across the backside isolation structure and the semiconductor substrate through the conductive feature.

A method of forming an image sensor includes forming a conductive feature on a frontside of a semiconductor substrate. The semiconductor substrate is patterned to form a backside isolation trench and a backside connecting trench in a pixel region such that the backside isolation trench and the backside connecting trench intersect. A through hole is patterned to extend through the semiconductor substrate in a peripheral region laterally offset from the pixel region. A conductive material is provided to form a backside isolation structure in the backside isolation trench, a backside connecting structure in the backside connecting trench, and a through substrate via in the through hole to contact the conductive feature. A conductive bridge is formed over a backside surface of the through substrate via and a backside surface of the backside connecting structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor, comprising:
   forming a conductive feature on a frontside of a semiconductor substrate;
   patterning the semiconductor substrate to form a backside isolation trench and a backside connecting trench in a pixel region such that the backside isolation trench and the backside connecting trench intersect;
   patterning a through hole extending through the semiconductor substrate in a peripheral region laterally offset from the pixel region;
   providing a first conductive layer to form a backside isolation structure in the backside isolation trench, and a backside connecting structure in the backside connecting trench;
   forming a through dielectric liner over a backside surface of the backside isolation structure and the backside connecting structure, wherein the through dielectric liner is formed extending into the through hole;

providing a second conductive layer to form a through substrate via in the through hole to contact the conductive feature;

forming a conductive bridge over a backside surface of the through substrate via and a backside surface of the backside connecting structure.

2. The method of claim 1, further comprising:
prior to providing the first conductive layer, forming a dielectric liner along sidewalls of the backside isolation trench, the backside connecting trench, and the through hole.

3. The method of claim 1, wherein the first conductive layer is formed over the pixel region; and the method further comprises:
patterning the first conductive layer to form an isolation grid within the backside isolation structure.

4. The method of claim 3, further comprising:
forming a dielectric layer over the backside of the semiconductor substrate between the backside isolation structure, the backside connecting structure, and the through substrate via.

5. The method of claim 3, further comprising:
forming the second conductive layer over the backside surface of the isolation grid and the through substrate via; and
patterning the second conductive layer forming a backside conductive trace over the isolation grid and forming the conductive bridge over the through substrate via and the backside connecting structure.

6. The method of claim 5, wherein the backside conductive trace is formed aligned with outer edges of the isolation grid.

7. The method of claim 5, wherein the backside conductive trace is formed such that a center of the backside conductive trace is offset from a center of the backside isolation structure and the backside conductive trace overlaps a portion of the backside isolation structure.

8. The method of claim 5, wherein the backside conductive trace is formed with a gap between sidewalls of the backside conductive trace and sidewalls of the backside isolation structure.

9. A method of forming an image sensor, comprising:
forming a backside isolation structure extending into a backside of a semiconductor substrate, wherein the backside isolation structure is formed laterally surrounding a pixel region;
forming a metal core within the backside isolation structure;
forming a conductive feature disposed over a front side of the semiconductor substrate, wherein the conductive feature is formed in a peripheral region that is laterally offset from the pixel region;
forming a through substrate via extending through the backside of the semiconductor substrate and contacting the conductive feature;
forming a backside conductive trace below the metal core, wherein a center of the backside conductive trace is offset from a center of the backside isolation structure; and
forming a conductive bridge over the semiconductor substrate that extends from the peripheral region to the pixel region and connects the metal core to the through substrate via.

10. The method of claim 9, Wherein the backside conductive trace is formed laterally surrounding the pixel region.

11. The method of claim 10, further comprising:
before forming the backside conductive trace, forming a dielectric material over the backside of the semiconductor substrate covering the metal core of the backside isolation structure; and
forming the backside conductive trace below the dielectric material.

12. The method of claim 11, wherein the dielectric material is formed extending over a backside of the through substrate via; and
the conductive bridge is formed below the dielectric material aligned under the conductive bridge and the through substrate via.

13. The method of claim 9, further comprising:
forming an additional through substrate via in the peripheral region and laterally offset from the through substrate via, wherein the additional through substrate via is formed extending through the backside of the semiconductor substrate and contacting the conductive feature.

14. The method of claim 9, further comprising:
forming a negative bias circuit connected to the conductive feature and the semiconductor substrate.

15. A method of forming an semiconductor device, comprising:
forming a first cavity opening through a backside of a semiconductor substrate, wherein the first cavity opening surrounds a photodetector;
forming a second cavity opening within a backside of the semiconductor substrate, wherein the second cavity opening is within a peripheral region;
forming a first dielectric layer over the backside of the semiconductor substrate and within the first cavity opening and the second cavity opening;
performing a removal process of the first dielectric layer from the first cavity opening and the second cavity opening;
providing a conductive layer within the first cavity opening and the second cavity opening forming a metal core within the first cavity opening and forming a connecting metal core within the second cavity opening, wherein the metal core and the connecting metal core intersect; and
forming a through substrate via through the backside of the semiconductor substrate, wherein the connecting metal core and the through substrate via intersect.

16. The method of claim 15, further comprising:
forming a first dielectric liner along exposed surfaces of the semiconductor substrate, the first cavity opening, and the second cavity opening, and forming the first dielectric layer over the first dielectric liner.

17. The method of claim 16, further comprising:
performing a removal process of the first dielectric layer forming a third cavity opening extending through the first dielectric layer and surrounding the photodetector, and forming a fourth cavity opening extending through the first dielectric layer and within the peripheral region, wherein after the removal process, the first dielectric layer is removed from the first cavity opening and the second cavity opening,
wherein the third cavity opening and the fourth cavity opening expose surfaces of the first dielectric liner within the semiconductor substrate, and the method further comprises:
forming a second dielectric liner along exposed surfaces of the first dielectric layer and exposed surfaces of the first dielectric liner within the third cavity opening and the fourth cavity opening.

18. The method of claim 17, further comprising:
forming a backside conductive trace over the backside of the semiconductor substrate, wherein the backside conductive trace is formed surrounding the photodetector; and
forming a conductive bridge over the backside of the semiconductor substrate within the peripheral region, wherein the conductive bridge is formed connected to the backside conductive trace.

19. The method of claim 18, wherein the backside conductive trace is formed over the metal core and between sidewalls of the second dielectric liner.

20. The method of claim 18, wherein the backside conductive trace is formed extending over a bottom surface of the second dielectric liner and a bottom surface of the metal core.

* * * * *